US012684947B2

(12) United States Patent  
Wang et al.

(10) Patent No.: US 12,684,947 B2  
(45) Date of Patent: Jul. 14, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Mengqi Wang, Beijing (CN); Hong Yi, Beijing (CN); Zhengkun Li, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 561 days.

(21) Appl. No.: 18/033,395

(22) PCT Filed: Jun. 29, 2022

(86) PCT No.: PCT/CN2022/102365  
§ 371 (c)(1),  
(2) Date: Apr. 24, 2023

(87) PCT Pub. No.: WO2024/000269  
PCT Pub. Date: Jan. 4, 2024

(65) Prior Publication Data  
US 2024/0381690 A1 Nov. 14, 2024

(51) Int. Cl.  
*H10K 59/121* (2023.01)  
*H10K 59/131* (2023.01)

(52) U.S. Cl.  
CPC ......... *H10K 59/121* (2023.02); *H10K 59/131* (2023.02)

(58) Field of Classification Search  
CPC ..... H10K 59/121; H10K 59/131; H10K 59/12  
(Continued)

(56) References Cited

U.S. PATENT DOCUMENTS

2022/0293715 A1 9/2022 Du et al.  
2023/0030745 A1 2/2023 Sun et al.  
(Continued)

FOREIGN PATENT DOCUMENTS

CN 106896592 A 6/2017  
CN 208569589 U 3/2019  
(Continued)

OTHER PUBLICATIONS

International Search Report in PCT/CN2022/102365 dated Jun. 29, 2022 in English.

*Primary Examiner* — Norman D Richards  
*Assistant Examiner* — Laura M Dykes  
(74) *Attorney, Agent, or Firm* — Collard & Roe, P.C.; William Collard

(57) ABSTRACT

A display substrate and a display device are provided. The display substrate includes a first display area and a second display area. The first display area includes first light-emitting units and first pixel circuits, and the first pixel circuits are electrically connected with the first light-emitting units; the second display area includes second light-emitting units and second pixel circuits, and the second pixel circuits are electrically connected with the second light-emitting units; the first light-emitting units are electrically connected with first pixel circuits through first connection traces; the first display area includes a first region and a second region, the first region is located between the second region and the second display area, and a line width of at least one first connection trace located in the second region is smaller than a line width of at least one first connection trace located in the first region.

20 Claims, 12 Drawing Sheets

(58) Field of Classification Search
    USPC .......................................................... 257/40
    See application file for complete search history.

(56)                         References Cited

U.S. PATENT DOCUMENTS

| | | | |
|---|---|---|---|
| 2023/0060545 | A1 | 3/2023 | Du et al. |
| 2023/0117888 | A1 | 4/2023 | Du et al. |

FOREIGN PATENT DOCUMENTS

| | | | | |
|---|---|---|---|---|
| CN | 110687726 | A | 1/2020 | |
| CN | 110989855 | A | 4/2020 | |
| CN | 113253872 | A | 5/2021 | |
| CN | 113571570 | A * | 10/2021 | ............ H10K 59/12 |
| CN | 114255666 | A | 3/2022 | |
| CN | 114550652 | A | 5/2022 | |
| CN | 114566522 | A | 5/2022 | |
| WO | 2022057527 | A1 | 3/2022 | |
| WO | 2022083348 | A1 | 4/2022 | |

* cited by examiner

DISPLAY SUBSTRATE AND DISPLAY DEVICE

CROSS REFERENCE TO RELATED APPLICATIONS

This application is the National Stage of PCT/CN2022/102365 filed on Jun. 29, 2022, the disclosure of which is incorporated by reference.

TECHNICAL FIELD

At least one embodiment of the present disclosure relates to a display substrate and a display device.

BACKGROUND

With people's constant pursuits of visual effects of display products, narrow-bezel and full-screen display has gradually become the major development trend of current organic light-emitting diode (OLED) display products.

SUMMARY

Embodiments of the present disclosure provides a display substrate and a display device.

The display substrate provided by embodiments of the present disclosure includes a first display area and a second display area, the first display area is on at least one side of the second display area in a first direction. The first display area includes a plurality of first light-emitting units and a plurality of first pixel circuits located on a base substrate, and at least one of the plurality of first pixel circuits is electrically connected with at least one of the plurality of first light-emitting units; the second display area includes a plurality of second light-emitting units and a plurality of second pixel circuits located on the base substrate, and at least one of the plurality of second pixel circuits is electrically connected with at least one of the plurality of second light-emitting units; at least part of the plurality of first light-emitting units are electrically connected with corresponding first pixel circuits through first connection traces; the first display area at least includes a first region and a second region, the first region is located between the second region and the second display area, and a line width of at least one first connection trace, at at least part of positions, located in the second region is smaller than a line width of at least one first connection trace located in the first region.

For example, according to an embodiment of the present disclosure, the first region is contiguous to the second region, and a maximum distance that a dividing line between the first region and the second region deviates from a straight line passing through a center of the dividing line and extending in a second direction is smaller than a size of one first pixel circuit along the first direction, and the first direction intersects with the second direction.

For example, according to an embodiment of the present disclosure, at least one first connection trace passing through the dividing line includes trace portions located in the first region and the second region respectively, and a line width of the trace portion located in the second region is smaller than a line width of the trace portion located in the first region.

For example, according to an embodiment of the present disclosure, the first display area includes a plurality of first pixel circuit rows arranged in the first direction, and the first pixel circuits in each first pixel circuit row are arranged in a second direction, the first region is contiguous to the second region, and a dividing line between the first region and the second region includes a dividing line parallel to one first pixel circuit row; a line width of the first connection trace electrically connected with at least one first pixel circuit located in the second region is smaller than a line width of the first connection trace electrically connected with at least one first pixel circuit located in the first region.

For example, according to an embodiment of the present disclosure, the line width of the first connection trace electrically connected with the at least one first pixel circuit located in the second region is set to be uniform, and the line width of the first connection trace electrically connected with the at least one first pixel circuit located in the first region is set to be uniform.

For example, according to an embodiment of the present disclosure, the line width of the first connection trace passing through the dividing line is set to be uniform.

For example, according to an embodiment of the present disclosure, the first display area further includes a third region, the third region is located at a side of the second region away from the first region, and a line width of at least a portion of at least one first connection trace located in the third region is greater than a line width of at least one first connection trace located in the second region.

For example, according to an embodiment of the present disclosure, in a direction perpendicular to the base substrate, the at least one first connection trace located in the third region is not overlapped with the first pixel circuit at a position where the at least one first connection trace has a greater line width.

For example, according to an embodiment of the present disclosure, a position of the at least one first connection trace located in the third region where the at least one first connection trace has a greater line width is located at a side of a midpoint of the at least one first connection trace away from the second display area.

For example, according to an embodiment of the present disclosure, a length in the first direction of a portion having a greater line width of the at least one first connection trace located in the third region is greater than a maximum size of a light-emitting region of the first light-emitting unit in the first direction.

For example, according to an embodiment of the present disclosure, the at least one first connection trace located in the third region has a portion with a greater line width, and the portion with a greater line width has different distances from two first connection traces which are adjacent to the at least one first connection trace and located at both sides of the at least one first connection trace.

For example, according to an embodiment of the present disclosure, the plurality of first light-emitting units include a plurality of first color light-emitting units, a plurality of second color light-emitting units, and a plurality of third color light-emitting units, the plurality of first light-emitting units include first columns and second columns alternately arranged along a second direction, each first column includes the first color light-emitting units and the third color light-emitting units alternately arranged along the first direction, and each second column includes the second color light-emitting units arranged along the first direction; the first direction intersects with the second direction, the first connection trace for connecting at least one first light-emitting unit in the first column includes a first line width dividing line, and the first connection trace for connecting at least one first light-emitting unit in the second column includes a second line width dividing line; the first line width dividing line and the second line width dividing line are not in a same straight line.

For example, according to an embodiment of the present disclosure, the first line width dividing line is located at a side of the second line width dividing line away from the second display area.

For example, according to an embodiment of the present disclosure, the plurality of first light-emitting units are electrically connected with the plurality of first pixel circuits in one-to-one correspondence through a plurality of first connection traces, and at least two first connection traces among the plurality of first connection traces have different lengths; and among the at least two first connection traces, a line width of at least part of positions of the first connection trace with a greatest length is smaller than a line width of the first connection trace with a smallest length.

For example, according to an embodiment of the present disclosure, the plurality of first connection traces include two groups of first connection traces, a length of the first connection trace with a greatest length in the first group is smaller than a length of the first connection trace with a smallest length in the second group, and a line width of each first connection trace in the first group is set to be uniform and equal and is greater than a line width of at least part of the first connection traces in the second group.

For example, according to an embodiment of the present disclosure, in a direction perpendicular to the base substrate, the first light-emitting units electrically connected with at least some of the first pixel circuits are not overlapped with the at least some of the first pixel circuits.

For example, according to an embodiment of the present disclosure, the first display area includes a fourth region and a fifth region arranged along the first direction; the fourth region is located between the fifth region and the second display area; the fourth region includes a part of the third region, the first region and the second region, and the fifth region includes another part of the third region; the plurality of first pixel circuits are all located in the fourth region, and the first light-emitting unit located in the fifth region is electrically connected with the first pixel circuit located in the fourth region.

For example, according to an embodiment of the present disclosure, the display substrate further includes: a plurality of signal lines, electrically connected with at least some of the plurality of first pixel circuits and of the plurality of second pixel circuits; a plurality of transmission lines; and a driving chip, located at a side of the first display area away from the second display area. At least some of the plurality of signal lines are electrically connected with the driving chip through at least some of the plurality of transmission lines, and the plurality of signal lines include portions located in the second display area and the fourth region; in a direction perpendicular to the base substrate, portions of the plurality of transmission lines located in the fifth region are overlapped with the first light-emitting units located in the fifth region.

For example, according to an embodiment of the present disclosure, at least part of the second light-emitting units are electrically connected with corresponding second pixel circuits through second connection traces, and a length of at least one first connection trace is greater than a length of at least one second connection trace.

For example, according to an embodiment of the present disclosure, in the first direction, a maximum size of the second region is greater than a maximum size of the first region.

For example, according to an embodiment of the present disclosure, a ratio of a minimum distance between two adjacent first connection traces located in the first region to a minimum distance between two adjacent first connection traces located in the second region is in a range of 0.5-1.5.

For example, according to an embodiment of the present disclosure, the first connection trace includes a transparent wire.

Another embodiment of the present disclosure provides a display device, which includes the display substrate according to any display substrate as mentioned above.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the present disclosure and thus are not limitative of the present disclosure.

DETAILED DESCRIPTION

Figure 1:
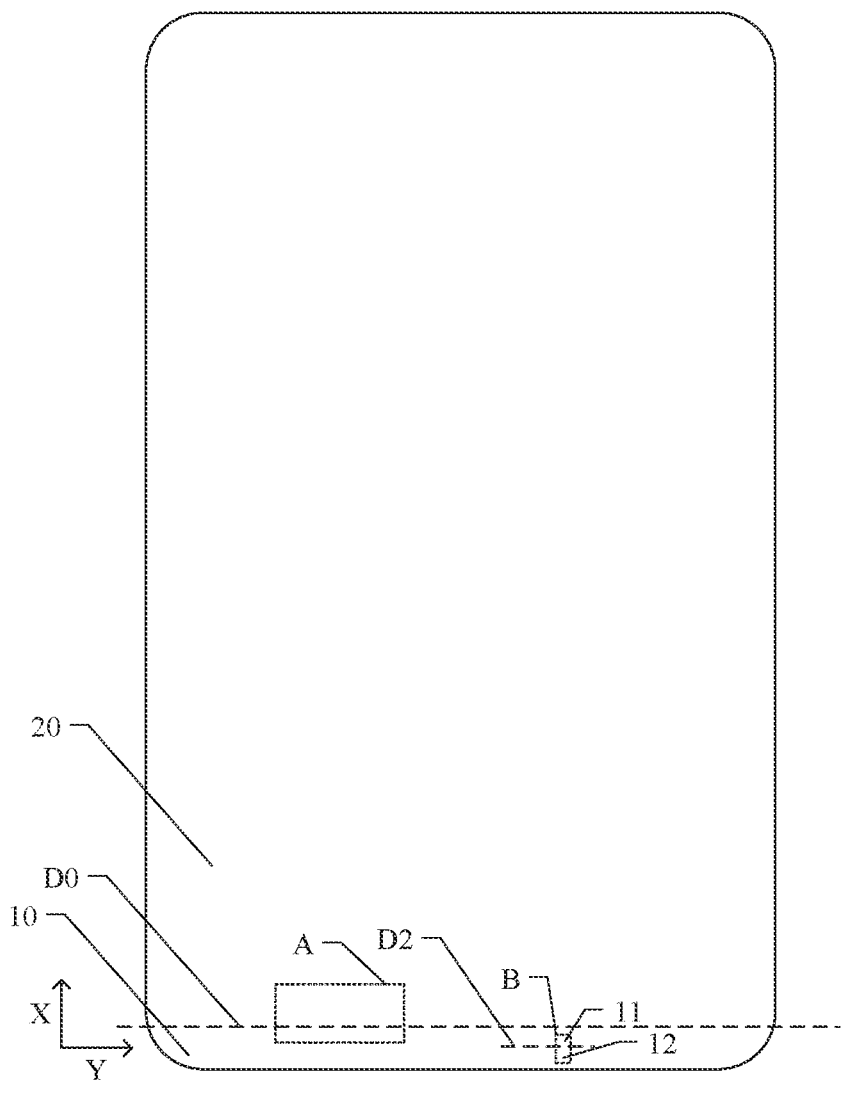
FIG. 1 is a plan view of a display area of a display substrate provided according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising." "include." "including." etc., are intended to specify that the elements or the objects stated before these terms encompass the elements or the objects and equivalents thereof listed after these terms, but do not preclude the other elements or objects.

Features such as "parallel", "perpendicular" and "identical" used in the embodiments of the present disclosure all include the meanings of "strictly parallel", "strictly perpendicular" and "strictly identical", and also the cases of "approximately parallel", "approximately perpendicular" and "approximately identical" containing certain errors, which fall within acceptable range of deviations for specific values determined by those ordinary skilled in the art by taking measurement errors and other errors related to specific numbers of measurements (for example, restrictions of measurement systems) into account. For example, "approximately" is intended to be within one or more standard deviations, or within 10% or 5% of the stated value(s). If the number of a component is not specified in the following of the embodiments of the present disclosure, it means one or more such components are provided or the number may be understood as at least one. The wording "at least one" refers to "one or more", and the wording "a plurality of" refers to "at least two". The wording "in the same layer" in the embodiments of the present disclosure refers to the relationships among multiple film layers formed by the same material after subjecting to the same step (for example, a one-step patterning process). The wording "in the same layer" here is not always intended to mean that the multiple film layers have the same thickness or the multiple film layers have the same height in a cross-sectional view.

The embodiment of the present disclosure provides a display substrate and a display device. The display substrate includes a first display area and a second display area, and the first display area is on at least one side of the second display area in a first direction. The first display area includes a plurality of first light-emitting units and a plurality of first pixel circuits located on a base substrate, and at least one of the plurality of first pixel circuits is electrically connected with at least one of the plurality of first light-emitting units; the second display area includes a plurality of second light-emitting units and a plurality of second pixel circuits located on the base substrate, and at least one of the plurality of second pixel circuits is electrically connected with at least one of the plurality of second light-emitting units; at least part of the first light-emitting units are electrically connected with corresponding first pixel circuits through first connection traces; the first display area at least includes a first region and a second region, the first region is located between the second region and the second display area, and a line width of at least one first connection trace, at at least part of positions, located in the second region is smaller than a line width of at least one first connection trace located in the first region. According to the display substrate provided by the embodiment of the present disclosure, by setting the line width of at least one first connection trace located in the second region to be smaller than the line width of at least one first connection trace located in the first region, it is beneficial to reducing the difference in parasitic capacitance between sub-pixels located in the first region and the second region, and alleviating the display Mura upon the display substrate being applied to a display device.

The display substrate and the display device provided by the embodiments of the present disclosure are described below with reference to the drawings.

Figure 2:
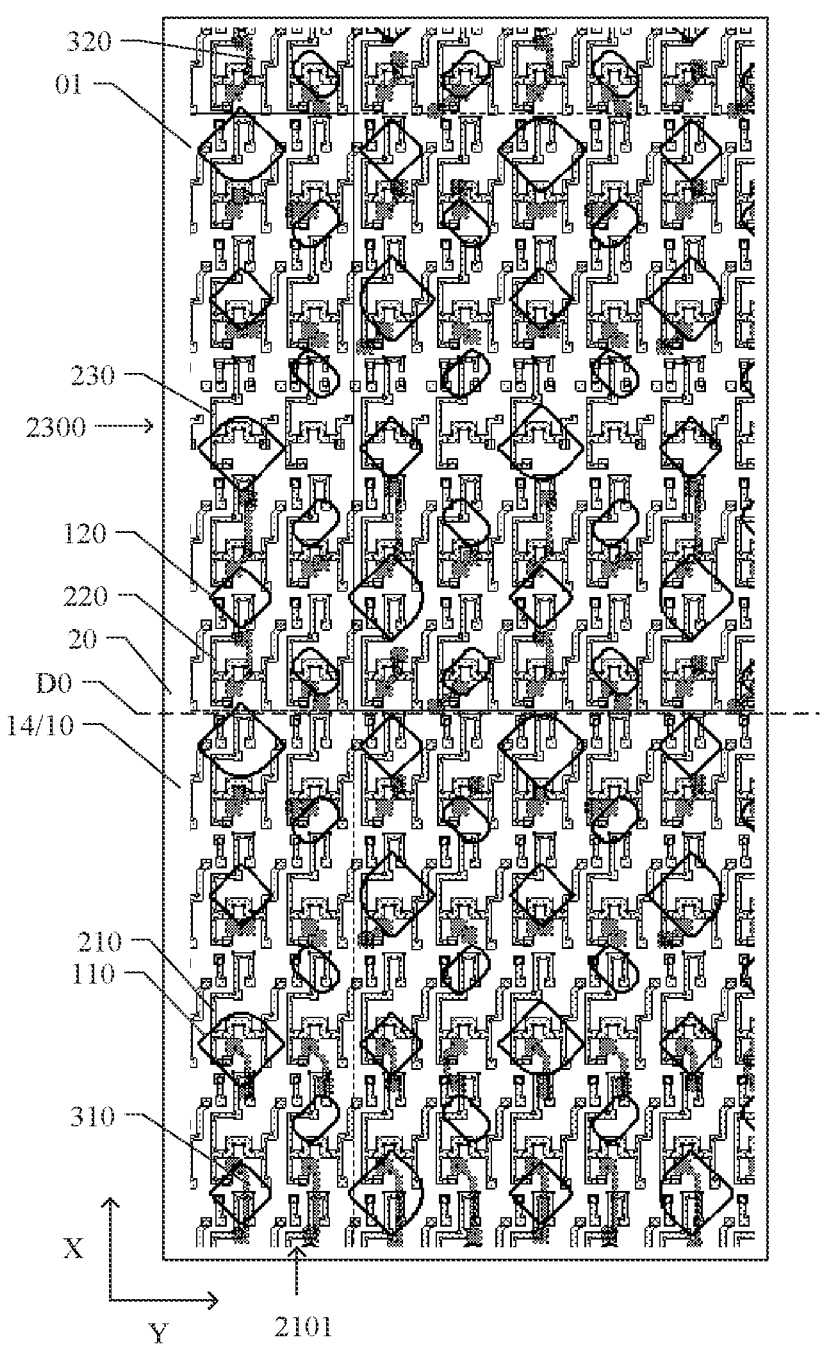
FIGS. 2 and 3 are enlarged views of a local region A shown in FIG. 1.
Figure 3:
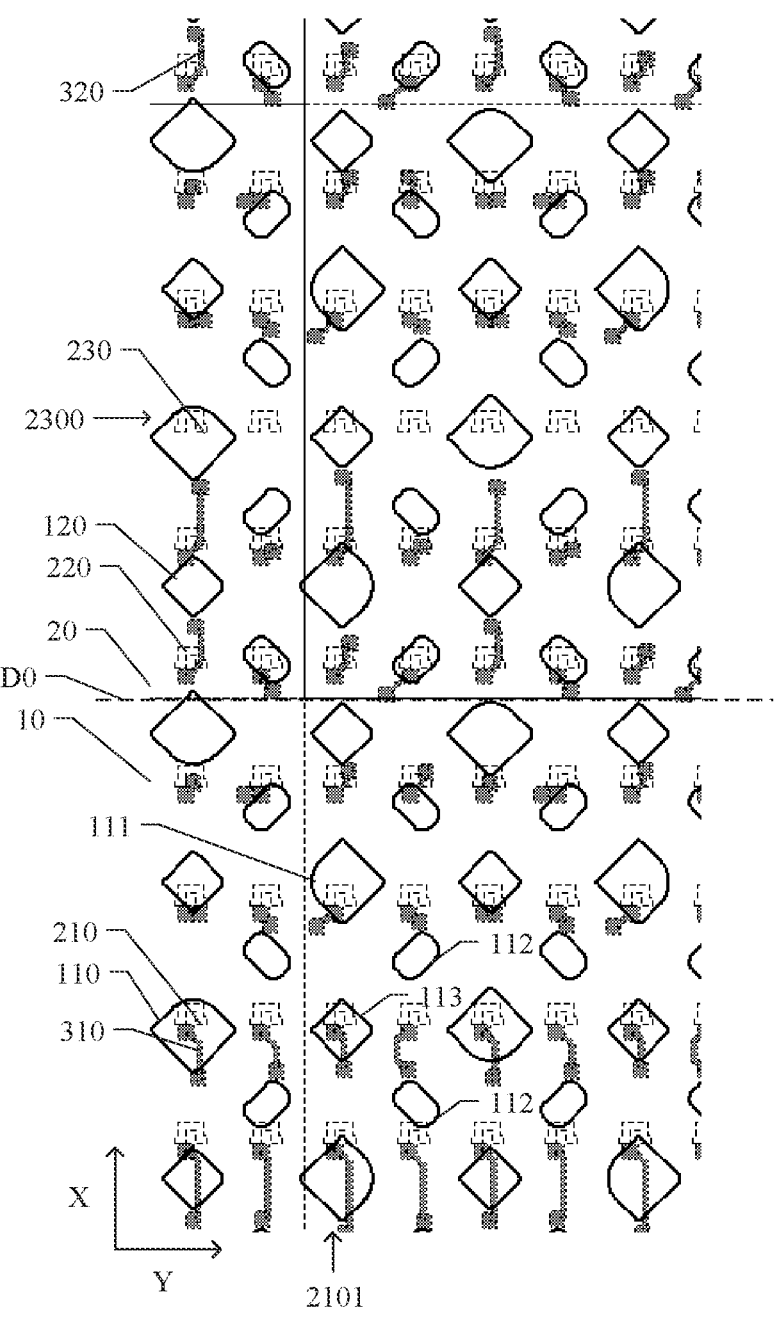
Figure 4:
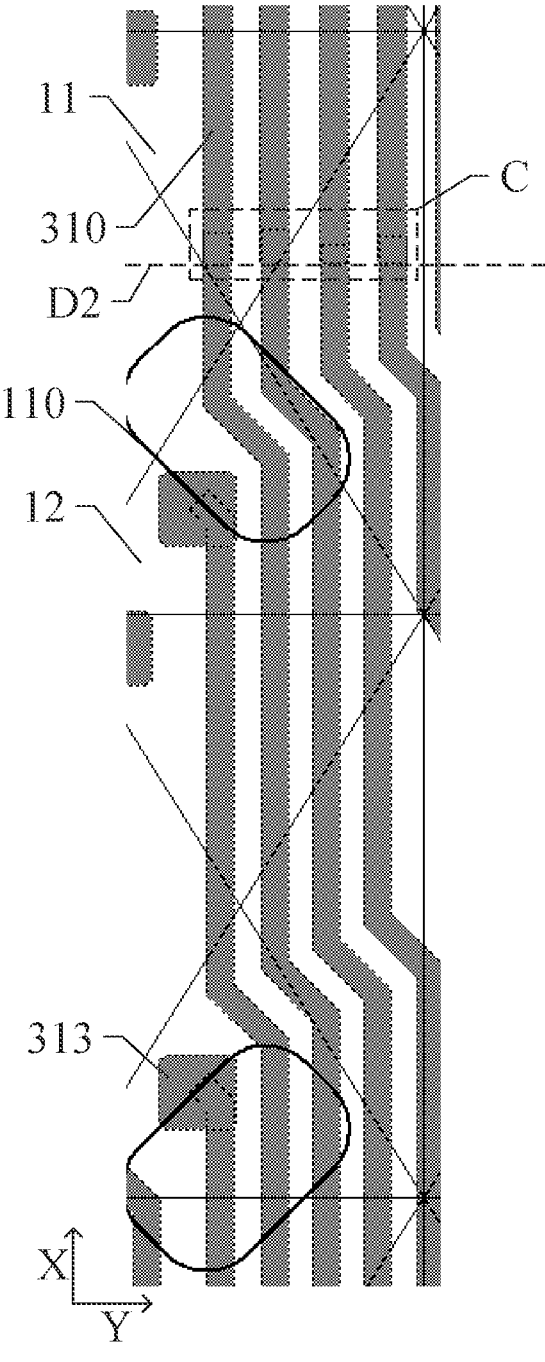
FIG. 4 is an enlarged view of a local region B shown in FIG. 1.
Figure 5:
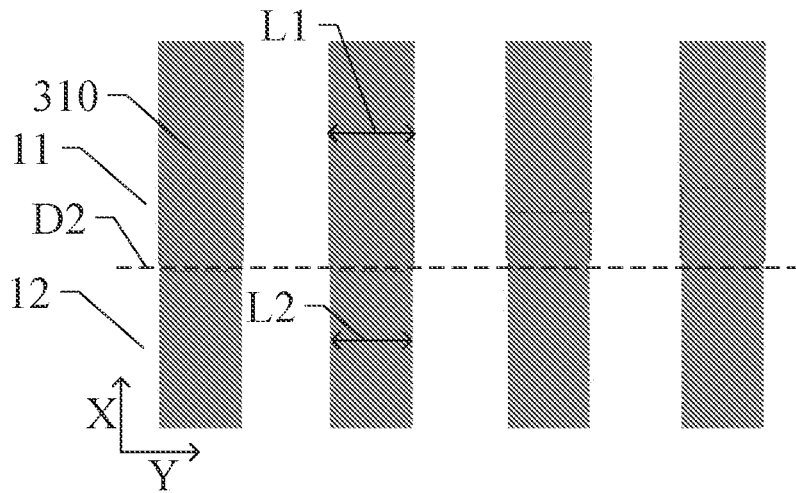
FIG. 5 is an enlarged view of a local region C shown in FIG. 4.

FIG. 1 is a plan view of a display area of a display substrate provided according to an embodiment of the present disclosure; FIGS. 2 and 3 are enlarged views of a local region A shown in FIG. 1; FIG. 4 is an enlarged view of a local region B shown in FIG. 1; and FIG. 5 is an enlarged view of a local region C shown in FIG. 4. As shown in FIGS. 1 to 5, the display substrate includes a first display area 10 and a second display area 20, and the first display area 10 is located at at least one side of the second display area 20 in a first direction. For example, as shown in FIG. 1, the first direction may be the X direction shown in the figure, but it is not limited thereto, and the first direction may also be the Y direction shown in the figure. For example, FIG. 1 schematically shows that the first display area 10 is located at one side of the second display area 20 in the X direction, but it is not limited thereto. The first display area 10 may be located at both sides of the second display area 20 in the X direction, or, the first display area 10 may be located at one side of the second display area 20 in the Y direction, or, the first display area 10 may be located at both sides of the second display area 20 in the Y direction.

As shown in FIGS. 1 to 5, the first display area 10 includes a plurality of first light-emitting units 110 and a plurality of first pixel circuits 210 located on a base substrate 01, and at least one of the plurality of first pixel circuits 210 is electrically connected with at least one of the plurality of first light-emitting units 110. At least some of the first light-emitting units 110 are electrically connected with the corresponding first pixel circuits 210 through first connection traces 310.

As shown in FIGS. 1 to 5, the second display area 20 includes a plurality of second light-emitting units 120 and a plurality of second pixel circuits 220 located on the base substrate 01, and at least one of the plurality of second pixel circuits 220 is electrically connected with at least one of the plurality of second light-emitting units 120.

For example, the second display area 20 further includes a plurality of dummy pixel circuits 230. The dummy pixel circuit 230 is insulated from both of the first light-emitting unit 110 and the second light-emitting unit 120. For example, the dummy pixel circuit 230 is not electrically connected to any light-emitting unit. For example, in a direction perpendicular to the base substrate 01, the dummy pixel circuit 230 is overlapped with the second light-emitting unit 120, and the dummy pixel circuit 230 is not electrically connected with the second light-emitting unit 120 overlapped therewith. In order to clearly illustrate the position of the dummy pixel circuit 230, FIG. 3 is a schematic diagram in which only a channel region is included in the pixel circuit shown in FIG. 2.

For example, as shown in FIGS. 1 to 5, the plurality of dummy pixel circuits 230 include at least one dummy pixel circuit row 2300, and the dummy pixel circuits 230 in the dummy pixel circuit row 2300 are arranged in a second direction, and the first direction intersects with the second direction. For example, as shown in FIG. 2, the arrangement direction of the first display area 10 and the second display area 20 intersects with the arrangement direction of the dummy pixel circuits 230 in one dummy pixel circuit row 2300. For example, the embodiment of the present disclosure schematically shows that the first direction is the X direction and the second direction is the Y direction. However, it is not limited thereto, and the first direction and the second direction can be interchanged. For example, the first direction and the second direction can be perpendicular to each other, but it is not limited thereto; and the included angle between the first direction and the second direction can be in the range of 30-80 degrees.

As shown in FIGS. 1 to 5, the first display area 10 includes at least a first region 11 and a second region 12, and the first region 11 is located between the second region 12 and the second display area 20. For example, the first region 11 and the second region 12 are arranged in the first direction.

As shown in FIGS. 1 to 5, a line width L2 of at least one first connection trace 310, at at least part of positions, located in the second region 12 is smaller than a line width L1 of at least one first connection trace 310 located in the first region 11. According to the display substrate provided by the embodiment of the present disclosure, by setting the line width of at least one first connection trace located in the second region to be smaller than the line width of at least one first connection trace located in the first region, it is beneficial to reducing the difference in parasitic capacitance between sub-pixels located in the first region and the second region, and alleviating the display Mura when the display substrate is applied to a display device.

The "line width" in the embodiment of the present disclosure may refer to an average line width of the first connection trace 310 or a maximum line width at the part with the largest width of the first connection trace 310. For example, the average line width L2 of portions at at least part of positions of at least one first connection trace 310 located in the second region 12 is smaller than the average line width L1 of at least one first connection trace 310 located in the first region 11. For example, a maximum line width L2 of portions at at least part of positions of at least one first connection trace 310 located in the second region 12 is smaller than a maximum line width L1 of at least one first connection trace 310 located in the first region 11.

For example, the line width L1 may be 2.5 microns, and the line width L2 may be 2-2.4 microns. The embodiment of the present disclosure is not limited thereto, and the values of the line width L1 and the line width L2 can be adjusted according to technological limits of actual product process.

For example, as shown in FIGS. 1 to 5, the first display area 10 and the second display area 20 include a plurality of sub-pixels, the sub-pixel located in the first display area 10 includes a first light-emitting unit 110 and a first pixel circuit 210 electrically connected with the first light-emitting unit 110, and the sub-pixel located in the second display area 20 includes a second light-emitting unit 120 and a second pixel circuit 220 electrically connected with the second light-emitting unit 120.

For example, as shown in FIGS. 1 to 5, at least part of the second light-emitting units 120 are electrically connected with the corresponding second pixel circuits 220 through second connection traces 320.

For example, the first pixel circuit 210 and the second pixel circuit 220 may each include a plurality of thin film transistors, and the first light-emitting unit 110 and the second light-emitting unit 120 may each include a first electrode, a light-emitting layer and a second electrode which are arranged in a stacked manner, with the first electrode located between the light-emitting layer and the base substrate. For example, the first electrode may be an anode and the second electrode may be a cathode. For example, the cathode can be formed of a material with high conductivity and low work function; and for example, the cathode can be made of a metal material. For example, the anode may be formed of a transparent conductive material with high work function. For example, the first connection trace 310 is configured to electrically connect a source electrode or a drain electrode of the thin film transistor of the first pixel circuit 210 with the first electrode of the first light-emitting unit 110, and the second connection trace 320 is configured to connect a source electrode or a drain electrode of the thin film transistor of the second pixel circuit 220 with the first electrode of the second light-emitting unit 120.

Figure 6:
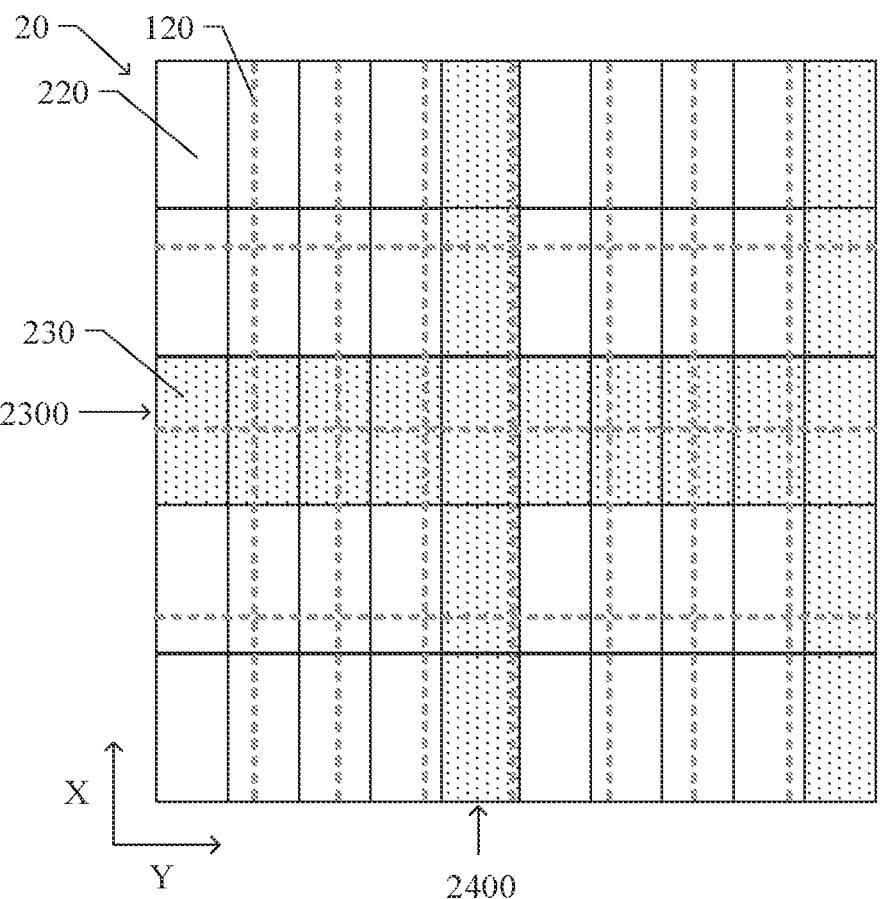
FIG. 6 is a schematic diagram of planar relationships between second pixel circuits and second light-emitting units, and planar relationships between dummy pixel circuits and second light-emitting units that are partially overlapped in a second display area.
Figure 7:
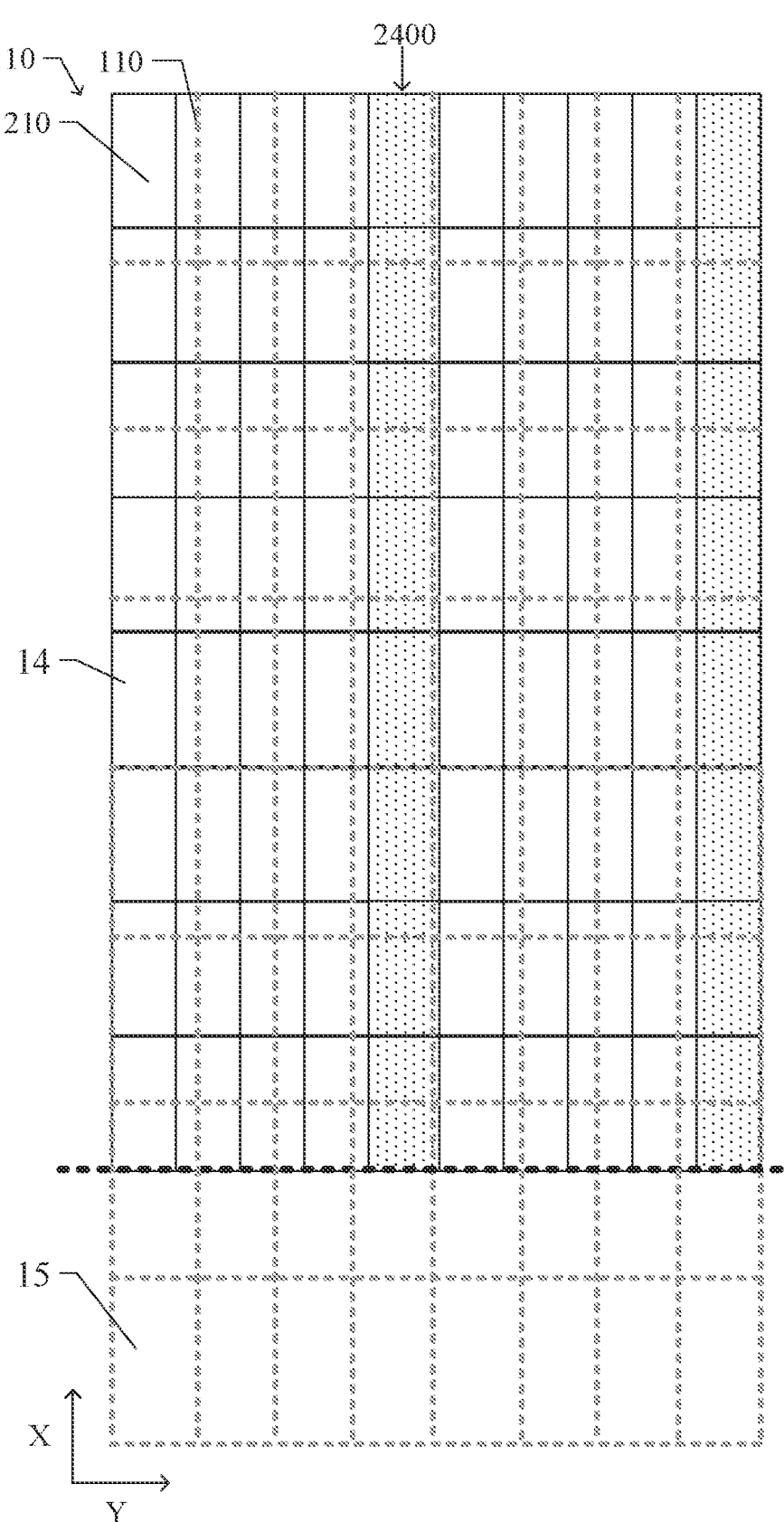
FIG. 7 is a schematic diagram of planar relationships of first pixel circuits and first light-emitting units that are partially overlapped in a first display area.

FIG. 6 is a schematic diagram of planar relationships between second pixel circuits and second light-emitting units, and planar relationships between dummy pixel circuits and second light-emitting units that are partially overlapped in a second display area, and FIG. 7 is a schematic diagram of planar relationships of first pixel circuits and first light-emitting units that are partially overlapped in a first display area. For example, FIG. 6 shows a minimum repeating unit in the second display area 20. For example, as shown in FIG. 6, in the second display area 20, four rows of second pixel circuits 220 and one dummy pixel circuit row 2300 correspond to four rows of second light-emitting units 120; for example, along the X direction, every four rows of second light-emitting units 120 constitute a minimum repeating unit row of light-emitting units in the second display area 20; one dummy pixel circuit row 2300 is arranged between every four rows of second pixel circuits 220, and every four rows of second pixel circuits 220 and one dummy pixel circuit row 2300 constitute a minimum repeating unit row of pixel circuits in the second display area 20. In this way, every four rows of second pixel circuits 220 can be electrically connected with the corresponding four rows of second light-emitting units 120, and the second pixel circuits 220 are overlapped with the second light-emitting units 120 electrically connected therewith in the direction perpendicular to the base substrate. By arranging the dummy pixel circuit row in the second display area, a distance along the first direction between the second pixel circuit and the second light-emitting unit electrically connected with each other can be smaller, which is beneficial to reducing a length of the second connection trace electrically connecting the second pixel circuit and the second light-emitting unit.

For example, as shown in FIG. 6, the second display area 20 further includes a plurality of dummy pixel circuit columns 2400. The arrangement direction of the dummy pixel circuits included in the dummy pixel circuit column 2400 intersects with the arrangement direction of the dummy pixel circuits included in the dummy pixel circuit row 2300, and the arrangement direction of the dummy pixel circuits included in the dummy pixel circuit column 2400 may be the same as the arrangement direction of the first display area 10 and the second display area 20.

For example, as shown in FIG. 6, eight columns of second pixel circuits 220 and two dummy pixel circuit columns 2400 correspond to eight columns of second light-emitting units 120; for example, along the Y direction, every eight columns of second light-emitting units 120 constitute a minimum repeating unit column of light-emitting units in the second display area 20; one dummy pixel circuit column 2400 is arranged between every four columns of second pixel circuits 220, and every eight columns of second pixel circuits 220 and two dummy pixel circuit columns 2400 constitute a minimum repeating unit column of pixel circuits in the second display area 20.

For example, as shown in FIG. 7, there is no dummy pixel circuit row 2300 arranged in the first display area 10, and four rows of first light-emitting units 110 correspond to five rows of first pixel circuits 210. Because the number of rows of the first light-emitting units 110 arranged in the first display area 10 is the same as that of the first pixel circuits 210, some rows of first light-emitting units 110 in the first display area 10 that are away from the second display area 20 have no overlap with the first pixel circuits 210 electrically connected thereto in the direction perpendicular to the base substrate; that is, in a direction along the first direction and away from the second display area, the first light-emitting units 110 and the first pixel circuits 210 are gradually staggered, so that the first pixel circuit 210 is not arranged at positions between part of first light-emitting units 110 and the base substrate. At this time, by arranging fanout wirings or other traces (such as VDD traces) between the base substrate and this part of first light-emitting units 110 having no overlap with the first pixel units 210, it can achieve the effect of narrowing the bezel of the display device.

For example, FIG. 6 and FIG. 7 schematically show that the X direction is the first direction, then the first display area 10 and the second display area 20 are arranged along the X direction, and the dummy pixel circuits in each dummy pixel circuit row 2300 are arranged along the Y direction, but it is not limited thereto; the first direction can also be the Y direction, then the first display area 10 and the second display area 20 are arranged along the Y direction, and the dummy pixel circuits in each dummy pixel circuit row 2300 are arranged along the X direction; that is, the dummy pixel circuit row 2300 and the dummy pixel circuit column 2400 can be interchanged. For example, in the case where the first direction is the Y direction, some of the first light-emitting units have no overlap with the first pixel circuits electrically connected thereto, and a Gate Driver on Array (GOA) circuit can be arranged between this part of first light-emitting units and the base substrate, which is beneficial to realizing the narrow bezel design at the gate driver side of the display screen.

FIGS. 1 to 3 show a dividing line D0 between the first display area 10 and the second display area 20. The first display area 10 is a display area where no dummy pixel circuit row is arranged, and the second display area 20 is a display area where the dummy pixel circuit row 2300 is arranged.

Figure 8:
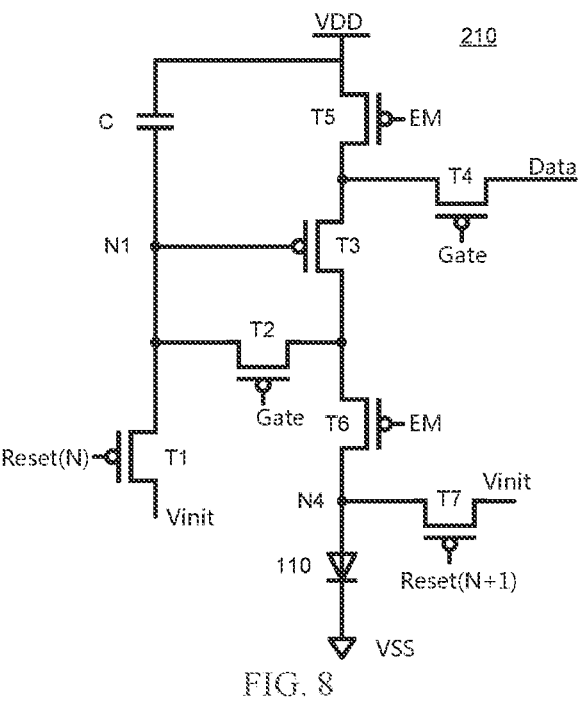
FIG. 8 is an equivalent diagram of a first pixel circuit.

FIG. 8 is an equivalent diagram of the first pixel circuit. Reference is made to the case where the first pixel circuit is used for driving the first light-emitting unit 110 as shown in FIG. 8 by way of example. As shown in FIG. 8, the first pixel circuit 210 includes a second reset transistor T1, a second light emission control transistor T5, a first light emission control transistor T6, a data writing transistor T4, a driving transistor T3, a threshold compensation transistor T2, a first reset control transistor T7 and a storage capacitor C. For example, the display substrate further includes a reset power signal line, a scanning signal line, a power signal line, a reset control signal line, a light emission control signal line and a data line.

For example, the first electrode of the threshold compensation transistor T2 is electrically connected with the first electrode of the driving transistor T3, and the second electrode of the threshold compensation transistor T2 is electrically connected with the gate electrode of the driving transistor T3; the first electrode of the first reset control transistor T7 is electrically connected with the reset power signal line to receive the reset signal Vinit, and the second electrode of the first reset control transistor T7 is electrically connected with the first electrode of the first light-emitting unit 110 (i.e., the N4 node); the first electrode of the data writing transistor T4 is electrically connected with the second electrode of the driving transistor T3, the second electrode of the data writing transistor T4 is electrically connected with the data line to receive the data signal Data, and the gate electrode of the data writing transistor T4 is electrically connected with the scanning signal line to receive the scanning signal Gate; the first electrode of the storage capacitor C is electrically connected with the power signal line, and the second electrode of the storage capacitor C is electrically connected with the gate electrode of the driving transistor T3; the gate electrode of the threshold compensation transistor T2 is electrically connected with the scanning signal line to receive the compensation control signal; the gate electrode of the first reset transistor T7 is electrically connected with the reset control signal line to receive the reset control signal Reset (N+1); the first electrode of the second reset transistor T1 is electrically connected with the reset power signal line to receive the reset signal Vinit, the second electrode of the second reset transistor T1 is electrically connected with the gate electrode of the driving transistor T3, and the gate electrode of the second reset transistor T1 is electrically connected with the reset control signal line to receive the reset control signal Reset (N); the gate electrode of the first light emission control transistor T6 is electrically connected with the light emission control signal line to receive the light emission control signal EM; the first electrode of the first light emission control transistor T6 is electrically connected with the first electrode of the driving transistor T3, and the second electrode of the first light emission control transistor T6 is electrically connected with the first electrode of the first light-emitting unit 110; the first electrode of the second light emission control transistor T5 is electrically connected with the power signal line to receive the first power signal VDD, the second electrode of the second light emission control transistor T5 is electrically connected with the second electrode of the driving transistor T3, the gate electrode of the second light emission control transistor T5 is electrically connected with the light emission control signal line to receive the light emission control signal EM, and the second electrode of the first light-emitting unit 110 is connected with the voltage terminal VSS. The above-mentioned power signal line refers to a signal line that outputs a voltage signal VDD, and can be connected with a voltage source to output a constant voltage signal, such as a positive voltage signal.

For example, the scanning signal may be as same as the compensation control signal, that is, the gate electrode of the data writing transistor T3 and the gate electrode of the threshold compensation transistor T2 may be electrically connected to the one and same signal line to receive the same signal, thereby reducing the number of the signal lines. For example, the gate electrode of the data writing transistor T3 and the gate electrode of the threshold compensation transistor T2 can also be electrically connected to different signal lines respectively; that is, the gate electrode of the data writing transistor T3 is electrically connected to a first scanning signal line and the gate electrode of the threshold compensation transistor T2 is electrically connected to a second scanning signal line, and the signals transmitted through the first scanning signal line and the second scanning signal line can be the same or different, so that the gate electrodes of the data writing transistor T3 and of the threshold compensation transistor T2 can be separately and independently controlled, and the flexibility of control for the pixel circuit is increased.

For example, the light emission control signal input into the first light emission control transistor T6 may be as same as the light emission control signal input into the second light emission control transistor T5, that is, the gate electrodes of the first light emission control transistor T6 and of the second light emission control transistor T5 may be electrically connected to one and the same signal line to receive the same signal, thereby reducing the number of the signal lines. For example, the gate electrodes of the first light emission control transistor T6 and of the second light emission control transistor T5 may also be electrically connected to different light emission control signal lines respectively, and the signals transmitted through these different light emission control signal lines may be the same or different.

For example, the reset control signal input into the first reset transistor T7 may be as same as the reset control signal input into the second reset transistor T1, that is, the gate electrode of the first reset transistor T7 and the gate electrode of the second reset transistor T1 may be electrically connected to one and the same signal line to receive the same signal, thereby reducing the number of the signal lines. For example, the gate electrode of the first reset transistor T7 and the gate electrode of the second reset transistor T1 may be electrically connected to different reset control signal lines, respectively. At this time, the signals on the different reset control signal lines may be the same or different.

For example, as shown in FIG. 8, during the operation of the display substrate, in the first stage of screen display, the second reset transistor T1 is turned on to initialize the voltage of the node N1; in the second stage of screen display, the data Data is stored in the node N1 through the data writing transistor T4, the driving transistor T3 and the threshold compensation transistor T2; in the third stage of light emission, the second light emission control transistor T5, the driving transistor T3 and the first light emission control transistor T6 are all turned on, and the first light-emitting unit 110 is positively conducted to emit light.

For example, the second pixel circuit 220 may have the same structure as the first pixel circuit 210. For example, the dummy pixel circuit may have the same structure as the first pixel circuit 210.

It should be noted that, in the embodiment of the present disclosure, in addition to the 7T1C (i.e., seven transistors and one capacitor) structure shown in FIG. 8, the first pixel circuit, the second pixel circuit and the dummy pixel circuit may also have other structures including other numbers of transistors, such as 7T2C structure, 6T1C structure, 6T2C structure or 9T2C structure, which is not limited in the embodiment of the present disclosure.

For the second display area, due to the existence of the dummy pixel circuit row, the relative position relationship between the second light-emitting unit and the second pixel circuit in different minimum repeating units is basically the same, which leads to a small difference in length between different second connection traces for connecting different second pixel circuits and corresponding second light-emitting units at the node N4, and also a small difference between parasitic capacitances generated at nodes N4 of different pixels.

For the first display area, because no dummy pixel circuit row is provided, the first connection trace connected with the first pixel circuit farther from the second display area has greater length, then a big length difference would be occurred between different first connection traces for connecting different first pixel circuits and corresponding first light-emitting units at the node N4, or, a big length difference would be occurred between the second connection trace and a part of the first connection traces having greater length, thus resulting in big difference between parasitic capacitances generated at the nodes N4 of different pixels.

According to the embodiment of the present disclosure, by setting the line width of at least one first connection trace, it is beneficial to reducing the difference between parasitic capacitances generated at nodes N4 of different pixels, and further alleviating the display Mura.

For example, as shown in FIGS. 1 to 5, the length of at least one first connection trace 310 is greater than that of at least one second connection trace 320, and the length of at least one first connection trace 310 is greater than that of at least one second connection trace 320. For example, the at least one second connection trace 320 is a connection trace with uniform line width.

For example, the line width of portions at at least part of positions of the first connection trace 310 with a length greater than the length of the second connection trace 320 is smaller than the line width of the second connection trace 320. For example, the line widths of the first connection trace 310, at respective positions, with a length greater than the length of the second connection trace 320 are all smaller than the line widths of the second connection trace 320 at respective positions. In the display substrate, assuming that the length of a first connection trace is significantly different from the length of a second connection trace, it would lead to significant difference in parasitic capacitances of the sub-pixels electrically connected with the first connection trace and the second connection trace having significantly different lengths, thus resulting in display Mura. According to the embodiment of the present disclosure, by setting the line width of the first connection trace, at least part of positions, with a greater length among the first connection trace and the second connection trace to be smaller, it is beneficial to reducing the difference in parasitic capacitance between sub-pixels electrically connected with the first connection trace and the second connection trace respectively, and alleviating display Mura.

For example, as shown in FIGS. 1 to 5, the plurality of first light-emitting units 110 are connected with the plurality of first pixel circuits 210 in one-to-one correspondence through a plurality of first connection traces 310. At least two of the plurality of first connection traces 310 have different lengths; and among the at least two first connection traces 310, the line width of the longest first connection trace 310, at at least part of positions, is smaller than the line width of the shortest first connection trace 310.

For example, as shown in FIGS. 1 to 5, the length of the first connection trace 310 electrically connected with the first light-emitting unit 110 closer to the second display area 20 is smaller than the length of the first connection trace 310 electrically connected with the first light-emitting unit 110 away from the second display area 20; and the line width of the longer first connection trace 310 may be set to be smaller than the line width of the shorter first connection trace 320.

In the display substrate, in the case where the lengths of different first connection traces are significantly different from each other, a big difference would be occurred between parasitic capacitances of the sub-pixels electrically connected with two first connection traces having significantly different lengths, thus resulting in display Mura. According to the embodiment of the present disclosure, by setting the line width of the longer first connection trace, at at least part of positions, among different first connection traces to be smaller, it is beneficial to reducing the difference in parasitic capacitance between sub-pixels electrically connected with first connection traces having different lengths, and reducing display Mura.

For example, as shown in FIGS. 1 to 5, the first region 11 is contiguous to the second region 12, and a maximum distance that the dividing line D2 between the first region 11 and the second region 12 deviates from a straight line passing through a center of the dividing line D2 and extending in the second direction is smaller than the size of one first pixel circuit 210 along the first direction.

For example, as shown in FIGS. 4 and 5, the dividing line D2 between the first region 11 and the second region 12 may be a straight line extending along the second direction, and the line width L1 of at least part of the first connection traces 310 located at the side of the straight line close to the second display area is greater than the line width L2 of at least part of the first connection traces 310 located at the side of the straight line away from the second display area. In an example of the embodiment of the present disclosure, a straight line extending in the second direction is taken as the dividing line between the first region and the second region, so as to quickly and conveniently divide the first display area into at least the first region close to the second display area and the second region away from the second display area.

For example, as shown in FIG. 4, the first connection trace 310 is electrically connected with the corresponding first light-emitting unit 110 through a connection pad 313. For example, the first connection trace 310 and the connection pad 313 may have an integrated structure, but the line width of the first connection trace 310 does not include the width of the connection pad 313. The first connection trace 310 may be configured as a broken line so as to bypass the position of the connection pad 313, in order to prevent from an occurrence of electrical connection. For example, in the case where the first connection trace 310 includes two layers of connection traces, at least one first connection trace in at least one layer of connection traces is configured as a broken line to bypass the connection pad in the other layer of connection traces, which is beneficial to improving the display yield of the display substrate.

In this example, the position of the dividing line D2 between the first region 11 and the second region 12 can be selected according to a change of density of the first connection traces 310. For example, the density of the first connection traces 310 in the second region 12 is greater than the density of the first connection traces 310 in the first region 11, the dividing line D2 between the first region 11 and the second region 12 can be selected in a region where the density of the first connection traces 310 is changed.

For example, as shown in FIGS. 1 to 5, the first connection trace 310 passing through the dividing line D2 includes two trace portions located in the first region 11 and the second region 12 respectively, and the line width of the trace portion located in the second region 12 is smaller than the line width of the trace portion located in the first region 11. For example, the one and same first connection trace 310 passing through the dividing line D2 may include two portions with different line widths, which is beneficial to reducing the parasitic capacitance of the sub-pixel connected with the first connection trace 310.

For example, as shown in FIGS. 1 to 5, the plurality of first pixel circuits 210 include a plurality of first pixel circuit columns 2101 arranged along the second direction, and the first pixel circuits 210 in each first pixel circuit column 2101 are arranged along the first direction. The first region 11 is contiguous to the second region 12, and the maximum distance that a sub-dividing line of the dividing line D2 between the first region 11 and the second region 12 deviates from a straight line passing through the center of the sub-dividing line and extending in the second direction is smaller than the size of one first pixel circuit 210 in the first direction, the sub-dividing line is located between two adjacent first pixel circuit columns 2101.

For example, as shown in FIG. 4, the dividing line D2 may not be overlapped with the light-emitting region of at least one first light-emitting unit 110. For example, the dividing line D2 may not be overlapped with light-emitting regions of first light-emitting units 110 configured to emit light of the same color. For example, the dividing line D2 may not be overlapped with the light-emitting regions of all of the first light-emitting units 110.

Figure 9:
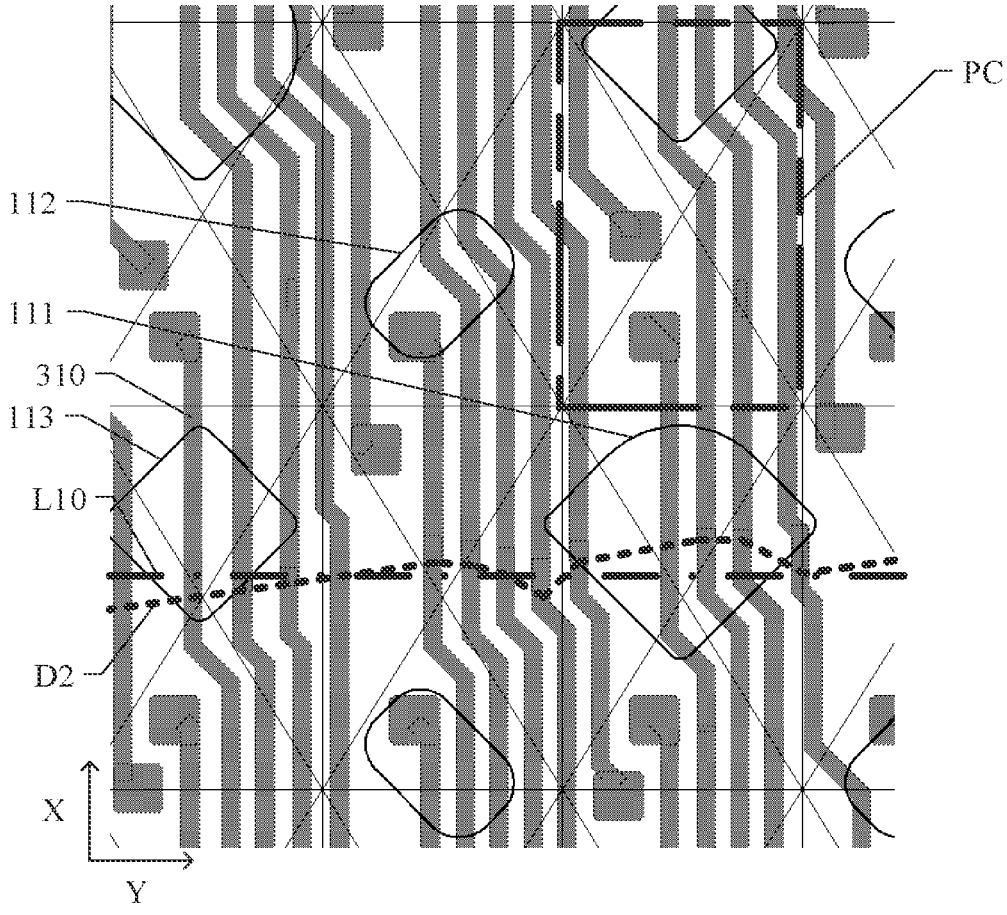
FIG. 9 is a schematic diagram of a partial planar structure including a dividing line between a first region and a second region provided according to an example of an embodiment of the present disclosure.

FIG. 9 is a schematic diagram of a partial planar structure including a dividing line between a first region and a second region provided according to an example of an embodiment of the present disclosure. The display substrate shown in FIG. 9 may have the same features as those of the display substrate shown in FIG. 4 except that the position of the dividing line between the first region and the second region is different from that shown in FIG. 4, and the repeated contents will be omitted here. The square block PC shown in FIG. 9 represents a region of one pixel circuit.

For example, the dividing line D2 between the first region 11 and the second region 12 in the display substrate shown in FIG. 9 is different from the dividing line D2 between the first region 11 and the second region 12 shown in FIG. 4 in that, the dividing line D2 shown in FIG. 9 is not a straight line extending in the second direction.

For example, as shown in FIG. 9, the dividing line D2 between the first region 11 and the second region 12 may be a curve or a broken line having an overall extension direction parallel to the second direction, and the maximum distance that the dividing line D2 deviates from a straight line L10 passing through the center of the dividing line D2 and extending in the second direction is smaller than the size of one first pixel circuit 210 in the first direction. For example, the center of the dividing line D2 may refer to the middle area of the dividing line.

For example, the dividing line D2 between the first region 11 and the second region 12 may be a curve or a broken line having an overall extension direction parallel to the second direction, and the maximum distance that the dividing line D2 deviates from a straight line L10 passing through the center of the dividing line D2 and extending in the second direction is smaller than ½ of the size of one first pixel circuit 210 in the first direction.

For example, as shown in FIG. 9, the dividing line D2 may not be overlapped with the light-emitting region of at least one first light-emitting unit 110. For example, the dividing line D2 may not be overlapped with the light-emitting regions of the first light-emitting units 110 configured to emit light of the same color. For example, the plurality of first light-emitting units 110 include a plurality of first color light-emitting units 111, a plurality of second color light-emitting units 112, and a plurality of third color light-emitting units 113; the dividing line D2 may be overlapped with the light-emitting regions of at least one color of light-emitting units among the first color light-emitting units 111, the second color light-emitting units 112 and the third color light-emitting units 113, and may not be overlapped with the light-emitting regions of at least one color of light-emitting units among the first color light-emitting units 111, the second color light-emitting units 112 and the third color light-emitting units 113. For example, the dividing line D2 may not be overlapped with the light-emitting regions of the second color light-emitting units 112, but be overlapped with the light-emitting regions of the first color light-emitting units 111.

For example, the dividing line D2 may be overlapped with the light-emitting regions of at least one color of light-emitting units. For example, the dividing line D2 may be overlapped with pixel circuits electrically connected to at least one color of light-emitting units.

For example, the dividing line D2 shown in FIGS. 4-5 and 9 includes a line width dividing line of one and the same first connection trace whose line width is changed. It may be a specific dividing line, which may be a straight line or a curve.

For example, one of the first color light-emitting unit 111 and the third color light-emitting unit 113 may be a blue light-emitting unit, the other one may be a red light-emitting unit, and the second color light-emitting unit 112 may be a green light-emitting unit. The blue light-emitting units and the red light-emitting units are alternately arranged in a first column along the first direction, the green light-emitting units are arranged in a second column along the first direction, and the first column and the second column are alternately arranged along the second direction. The position where the density of the first connection traces electrically connected with the first column of light-emitting units is changed may be different from the position where the density of the first connection traces electrically connected with the second column of light-emitting units is changed, as a result, the position of the dividing line corresponding to the first connection traces electrically connected with the first column of light-emitting units and the position of the dividing line corresponding to the first connection traces electrically connected with the second column of light-emitting units may not be in the same straight line. In this example, the position of the dividing line is adjusted according to the positions of sub-pixels of different colors, so that the position of the dividing line can be closer to the position where the density of the first connection traces is changed.

Figure 10:
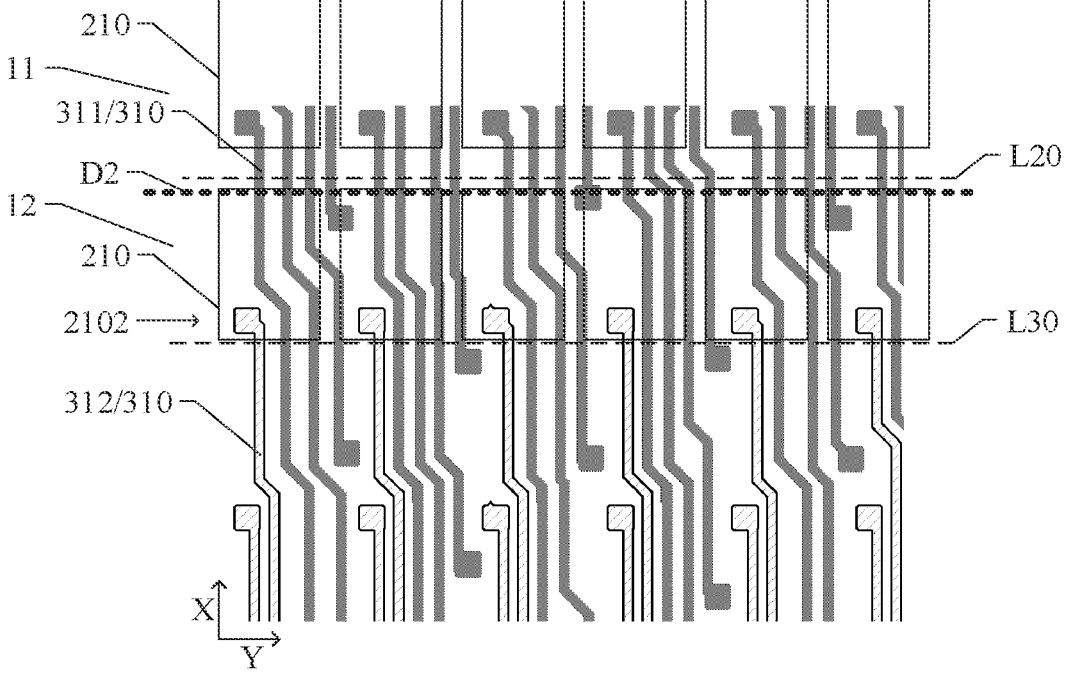
FIG. 10 is a schematic diagram of a partial planar structure including a dividing line between a first region and a second region provided according to another example of an embodiment of the present disclosure.

FIG. 10 is a schematic diagram of a partial planar structure including a dividing line between a first region and a second region provided according to another example of an embodiment of the present disclosure. Features of the display substrate shown in FIG. 10 may be the same as those of the display substrate shown in FIG. 4 except that the position of the dividing line between the first region and the second region is different from that shown in FIG. 4, and the repeated contents will be omitted here.

For example, the dividing line D2 between the first region 11 and the second region 12 in the display substrate shown in FIG. 10 is different from the dividing line D2 between the first region 11 and the second region 12 shown in FIG. 4 in that, the dividing line D2 in this example is delimited by a certain first pixel circuit row 2102.

For example, as shown in FIG. 10, the first display area 10 includes a plurality of first pixel circuit rows 2102 arranged in a first direction, and the first pixel circuits 210 in each first pixel circuit row 2102 are arranged in a second direction. The first region 11 is contiguous to the second region 12, and the dividing line D2 between the first region 11 and the second region 12 includes a connecting line of end points of one first pixel circuit row 2102 that are close to the second display area 20; the line width of the first connection trace 310 connected with at least one first pixel circuit 210 located in the second region 12 is smaller than the line width of the first connection trace 310 connected with at least one first pixel circuit 210 located in the first region 11.

For example, as shown in FIG. 10, the dividing line D2 may be a connecting line of end points of the first row of the first pixel circuit rows 2102 located in the second region 12, with these end points being closer to the second display area 20, but it is not limited thereto. The dividing line D2 may also be a connecting line of end points of the last row of the first pixel circuit rows located in the first region 11, with these end points being away from the second display area; or the dividing line D2 may be a dividing line at any position between two first pixel circuit rows. For example, the dividing line D2 is not overlapped with the light-emitting regions of the light-emitting units. For example, the dividing line D2 in the example shown in FIG. 10 may be a dummy line, which is located between two first pixel circuit rows.

For example, as shown in FIG. 10, the first connection traces 310 include a first connection trace 311 electrically connected with the first pixel circuit 210 located in the first region 11 and a first connection trace 312 electrically connected with the first pixel circuit 210 located in the second region 12, and the line width of at least one first connection trace 312 is smaller than the line width of at least one first connection trace 311.

For example, as shown in FIG. 10, the line width of the first connection trace 312 electrically connected with at least one first pixel circuit 210 located in the second region 12 is set to be uniform, and the line width of the first connection trace 311 electrically connected with at least one first pixel circuit 210 located in the first region 11 is set to be uniform. For example, the line widths of all the first connection traces 312 electrically connected with all the first pixel circuits 210 located in the second region 12 are set to be uniform, and/or, the line widths of all the first connection traces 311 electrically connected with all the first pixel circuits 210 located in the first region 11 are set to be uniform. The above-mentioned "set to be uniform" means that the line width is not changed.

For example, as shown in FIG. 10, the line width of the first connection trace 310 passing through the dividing line D2 is set to be uniform. For example, the first connection trace 310 passing through the dividing line D2 is the first connection trace 311 electrically connected with the first pixel circuit 210 in the first region 11, and the line width of the one and same first connection trace 311 passing through the dividing line D2 is set to be uniform.

In the display substrate provided by this example, the first region and the second region are divided by the first pixel circuit row, and the line width of the one and same first connection trace passing through the dividing line between the first region and the second region is set to be uniform, which is beneficial to simplifying the patterning process of the first connection traces with different line widths.

For example, as shown in FIG. 10, the plurality of first connection traces 310 include two groups of first connection traces 310, e.g., first connection traces 311 electrically connected with the first pixel circuits located in the first region 11 and first connection traces 312 electrically connected with the first pixel circuits located in the second region 12. For example, the length of the longest first connection trace 310 (e.g., the first connection trace 311) in the first group is smaller than the length of the shortest first connection trace 310 (e.g., the first connection trace 312) in the second group, the line width of each of the first connection traces 310 in the first group is uniform and equal and is greater than the line width of at least part of the first connection traces 310 in the second group.

For example, the position of the dividing line D2 between the first region 11 and the second region 12 can be selected according to the change of the length of the first connection trace 310. For example, the length of the first connection traces 310 in the area formed by the first region 11 and the second region 12 gradually increases in a direction from the second display area pointing to the first display area, the region where the first pixel circuit 210 electrically connected with the longer first connection trace 310 is located can be selected as the second region 12, while the region where the first pixel circuit 210 electrically connected with the shorter first connection trace 310 is located can be selected as the first region 11.

For example, as shown in FIG. 10, a first straight line L20 extending in the second direction passes through the first connection traces 310 located in the first region 11, and a second straight line L30 extending in the second direction passes through the first connection traces 310 located in the second region 12, and the number of the first connection traces 310 passed by the first straight line L20 is smaller than the number of the first connection traces 310 passed by the second straight line L30. For example, the length of the first straight line L20 is as same as that of the second straight line L30, a connecting line of starting points of the two straight lines is parallel to the first direction, and a connecting line of terminating points of the two straight lines is parallel to the first direction. For example, the length of the first straight line L20 is smaller than the size of the first display area in the second direction. For example, the first straight line L20 passes through the first connection traces electrically connected with at least two columns of light-emitting units.

For example, as shown in FIG. 10, the density of the first connection traces 310 in at least partial region of the second region 12 is greater than the maximum density of the first connection traces 310 in the first region 11.

In this example, the position of the dividing line D2 between the first region 11 and the second region 12 can be selected according to a change of density of the first connection traces 310. For example, the density of the first connection traces 310 in the second region 12 is greater than the density of the first connection traces 310 in the first region 11, the dividing line D2 between the first region 11 and the second region 12 can be selected in a region where the density of the first connection traces 310 is changed.

For example, as shown in FIG. 10, the ratio of the minimum distance between two adjacent first connection traces 310 located in the first region 11 to the minimum distance between two adjacent first connection traces 310 located in the second region 12 is 0.5-1.5. For example, the ratio of the minimum distance between two adjacent first connection traces 310 located in the first region 11 to the minimum distance between two adjacent first connection traces 310 located in the second region 12 is 0.6-1.4. For example, the ratio of the minimum distance between two adjacent first connection traces 310 located in the first region 11 to the minimum distance between two adjacent first connection traces 310 located in the second region 12 is 0.7-1.3. For example, the ratio of the minimum distance between two adjacent first connection traces 310 located in the first region 11 to the minimum distance between two adjacent first connection traces 310 located in the second region 12 is 0.8-1.2. For example, the ratio of the minimum distance between two adjacent first connection traces 310 located in the first region 11 to the minimum distance between two adjacent first connection traces 310 located in the second region 12 is 0.9-1.1.

For example, the minimum distance between two adjacent first connection traces 310 located in the first region 11 is greater than the minimum distance between two adjacent first connection traces 310 located in the second region 12.

In the case where the density of the first connection traces located in the first region is greater than that of the first connection traces located in the second region, the distance between two adjacent first connection traces located in the second region is smaller than the distance between two adjacent first connection traces located in the first region. In the case where the distance between two adjacent first connection traces is decreased (for example, the distance between two adjacent first connection traces is smaller than 2.5 microns), by reducing the line width of at least one first connection trace located in the second region, it can increase the distance between two adjacent first connection traces located in the second region, which is beneficial to increasing the yield of the display substrate.

For example, the minimum distance between two adjacent first connection traces 310 located in the first region 11 is smaller than or equal to the minimum distance between two adjacent first connection traces 310 located in the second region 12. By adjusting the line width of the first connection traces in the second region, the minimum distance between two adjacent first connection traces located in the second region can be greater than or equal to the minimum distance between two adjacent first connection traces located in the first region.

The distance between two adjacent first connection traces as mentioned above may be different at different positions, and the comparison is made between values of minimum distances between two adjacent first connection traces located in the first region and in the second region.

Figure 11:
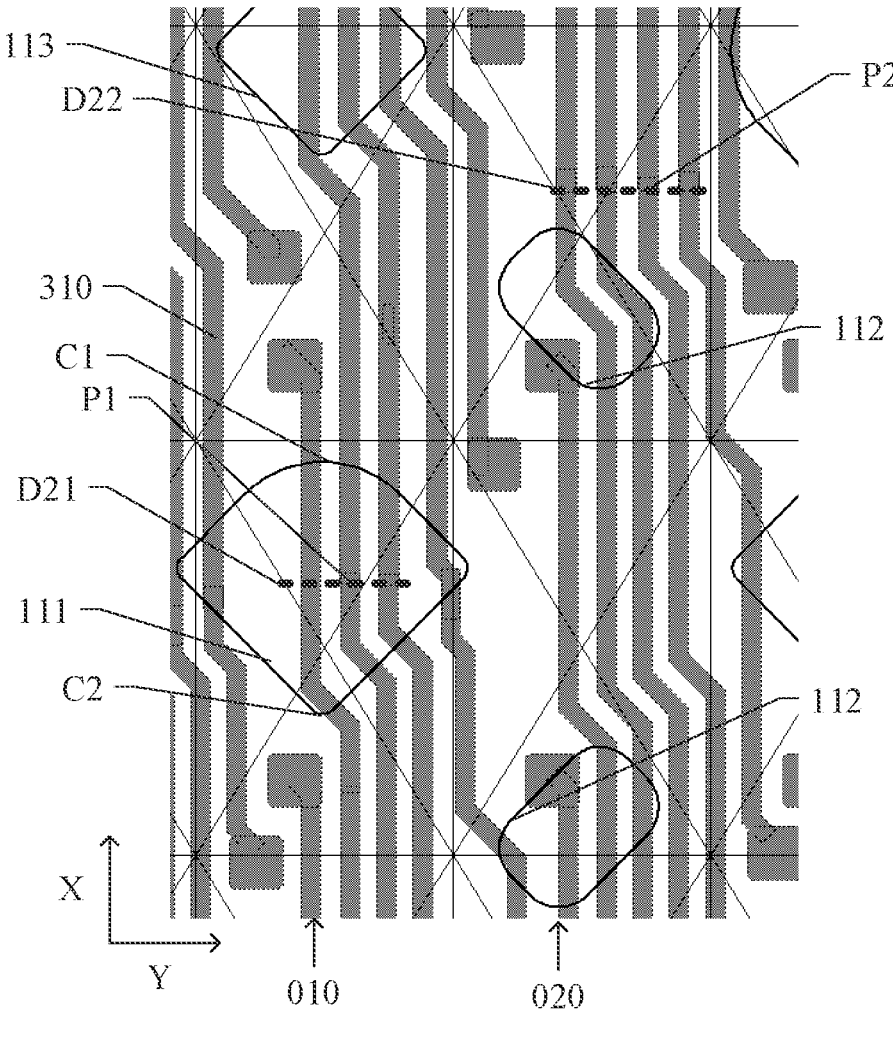
FIG. 11 is a schematic diagram of a partial planar structure including a dividing line between a first region and a second region provided according to another example of an embodiment of the present disclosure.

FIG. 11 is a schematic diagram of a partial planar structure including a dividing line between a first region and a second region provided according to another example of an embodiment of the present disclosure. The display substrate shown in FIG. 11 is different from the display substrate shown in FIG. 4 in the position of the dividing line between the first region and the second region, and other features of the display substrate shown in FIG. 11 can be the same as those of the display substrate shown in FIG. 4 and hence will not be repeated here.

For example, as shown in FIGS. 3 and 11, the plurality of first light-emitting units 110 include a plurality of first color light-emitting units 111, a plurality of second color light-emitting units 112 and a plurality of third color light-emitting units 113. The plurality of first light-emitting units 110 include a first column 010 and a second column 020 alternately arranged in the second direction; the first column 010 includes the first color light-emitting units 111 and the third color light-emitting units 113 alternately arranged in the first direction, and the second column 020 includes the second color light-emitting units 112 arranged in the first direction. For example, adjacent first and second columns 010 and 020 are shifted from each other in the second direction. For example, the first color light-emitting units 111 and the third color light-emitting units 113 are alternately arranged along the second direction to form a first row, and a second row is arranged between two first rows; the second row includes the second color light-emitting units 112 arranged along the second direction; and the first rows and the second rows are alternately arranged along the first direction.

For example, one of the first color light-emitting unit 111 and the third color light-emitting unit 113 emits red light, and the other one emits blue light; the second color light-emitting unit 112 emits green light.

For example, as shown in FIG. 11, an intersection of the dividing line D2 and the center line of the first column 010 is a first intersection P1, and an intersection of the dividing line D2 and the center line of the second column 020 is a second intersection P2, and a connecting line of the first intersection P1 and the second intersection P2 is not parallel to the second direction.

For example, as shown in FIG. 11, the first connection trace 310 for connecting at least one first light-emitting unit 110 in the first column 010 includes a first line width dividing line D21, and the first connection trace 310 for connecting at least one first light-emitting unit 110 in the second column 020 includes a second line width dividing line D22; the first line width dividing line D21 and the second line width dividing line D22 are not in the same straight line. For example, the first intersection P1 is in the first line width dividing line D21, and the second intersection P2 is in the second line width dividing line D22.

For example, as shown in FIG. 11, there is a certain interval between the dividing line D2 where the first intersection P1 is located and the dividing line D2 where the second intersection P2 is located, and the ratio of the size of the interval along the first direction to the size of the first pixel circuit along the first direction may be 0.1-1.8. For example, the ratio of the size of the interval along the first direction to the size of the first pixel circuit along the first direction may be 0.2 to 1.7. For example, the ratio of the size of the interval along the first direction to the size of the first pixel circuit along the first direction may be 0.3 to 1.6. For example, the ratio of the size of the interval along the first direction to the size of the first pixel circuit along the first direction may be 0.4 to 1.5. For example, the ratio of the size of the interval along the first direction to the size of the first pixel circuit along the first direction may be 0.5 to 1.4. For example, the ratio of the size of the interval along the first direction to the size of the first pixel circuit along the first direction may be 0.6 to 1.3. For example, the ratio of the size of the interval along the first direction to the size of the first pixel circuit along the first direction may be 0.7 to 1.2. For example, the ratio of the size of the interval along the first direction to the size of the first pixel circuit along the first direction may be 0.8 to 1.1. For example, the ratio of the size of the interval along the first direction to the size of the first pixel circuit along the first direction may be 0.9 to 1.

For example, as shown in FIG. 11, the first intersection P1 is located at the side of the second intersection P2 away from the second display area 20.

For example, as shown in FIG. 11, the first line width dividing line D21 is located at the side of the second line width dividing line D22 away from the second display area 20.

For example, the position where the density of the first connection traces electrically connected with the first column of light-emitting units is changed may be different from the position where the density of the first connection traces electrically connected with the second column of light-emitting units is changed, as a result, the position of the dividing line corresponding to the first connection traces electrically connected with the first column of light-emitting units and the position of the dividing line corresponding to the first connection traces electrically connected with the second column of light-emitting units are not in the same straight line.

For example, for the first column of light-emitting units and the second column of light-emitting units located in the first display area, the first one in the first column and the first one in the second column that are at the side close to the second display area have different positions. For example, the second column of light-emitting units can lag behind the first column of light-emitting units by a certain distance, the last one in the first column of light-emitting units and the last one in the second column of light-emitting units that are at the side away from the second display area have different positions, and the position where the first connection traces electrically connected with the second column of light-emitting units have a greater density will be closer to the second display area than the position where the first connection traces electrically connected with the first column of light-emitting units have a greater density. In this example, the position of the dividing line is adjusted according to the positions of sub-pixels of different colors, so that the position of the dividing line can be closer to the position where the density of the first connection traces is changed.

For example, as shown in FIG. 11, the dividing line D2 may not be overlapped with the light-emitting region of at least one first light-emitting unit 110. For example, the dividing line D2 may not be overlapped with the light-emitting regions of the first light-emitting units 110 configured to emit light of the same color. For example, the dividing line D2 may be overlapped with the light-emitting regions of at least one color of light-emitting units among the first color light-emitting units 111, the second color light-emitting units 112 and the third color light-emitting units 113, and may not be overlapped with the light-emitting regions of at least one color of light-emitting units among the first color light-emitting units 111, the second color light-emitting units 112 and the third color light-emitting units 113. For example, the dividing line D2 may not be overlapped with the light-emitting regions of the second color light-emitting units 112, but may be overlapped with the light-emitting regions of the first color light-emitting units 111.

For example, as shown in FIG. 11, a vertex angle of the light-emitting region of the first color light-emitting unit 111 includes a first angle portion C1 and a second angle portion C2 which are oppositely arranged, and the distance from the intersection point of extension lines or tangent lines of two sides constituting the first angle portion C1 to the center of the sub-pixel is greater than the distance from the intersection point of two sides constituting the second angle portion C2 or extension lines or tangent lines of the two sides to the center of the sub-pixel; the first color light-emitting unit 111 includes a first type sub-pixel and a second type sub-pixel; the direction along which the vertex of the first angle portion C1 points to the vertex of the second angle portion C2 is different in different types of sub-pixels; the direction along which the vertex of the first angle portion C1 points to the vertex of the second angle portion C2 in the first type sub-pixel is a first pointing direction, while the direction along which the vertex of the first angle portion C1 points to the vertex of the second angle portion C2 in the second type sub-pixel is a second pointing direction, and the first pointing direction is opposite to the second pointing direction. For example, the second pointing direction can be the direction indicated by the arrow of the X direction, the first pointing direction can be opposite to the direction indicated by the arrow of the X direction, and the first pointing direction and the second pointing direction can be interchanged; for example, the first pointing direction can also be the direction indicated by the arrow of the Y direction, the second pointing direction can also be opposite to the direction indicated by the arrow of the Y direction, and the first pointing direction and the second pointing direction can be interchanged.

For example, as shown in FIG. 11, the first color light-emitting unit 111 may be a sub-pixel emitting blue light. The first angle portion C1 of the light-emitting region of the first color light-emitting unit 111 may be a rounded angle. The above-mentioned rounded angle can refer to a vertex angle formed by a segment of curve, the curve can be a circular arc or an irregular curve, such as a curve sectioned from an ellipse, a wavy line, etc. The embodiment of the present disclosure schematically shows that the curve has an outwardly convex shape relative to the center of the sub-pixel but is not limited thereto, and the curve may also have an inwardly concave shape relative to the center of the sub-pixel. For example, in the case where the curve is a circular arc, the central angle of the circular arc can range from 10 degrees to 150 degrees. For example, the central angle of the circular arc can range from 60 degrees to 120 degrees. For example, the central angle of the circular arc can be 90 degrees. For example, the curve length of the rounded angle included in the first angle portion C1 may be 10 to 60 microns.

For example, the second light-emitting unit may have the same features (including shapes and arrangement rules) as the first light-emitting unit, which will not be described in details here.

Figure 12:
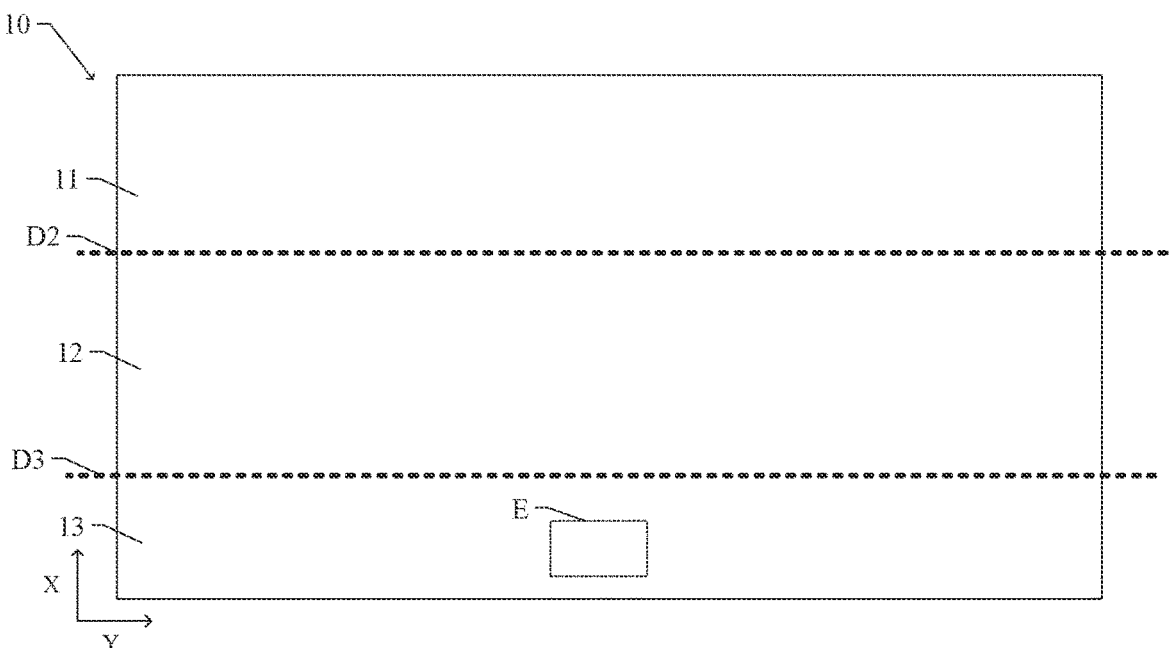
FIG. 12 is a schematic plan view of a first display area in the display substrate shown in FIG. 1.

FIG. 12 is a schematic plan view of a first display area in the display substrate shown in FIG. 1. For example, as shown in FIG. 12, along the first direction, the maximum size of the second region 12 is greater than the maximum size of the first region 11.

Figure 13:
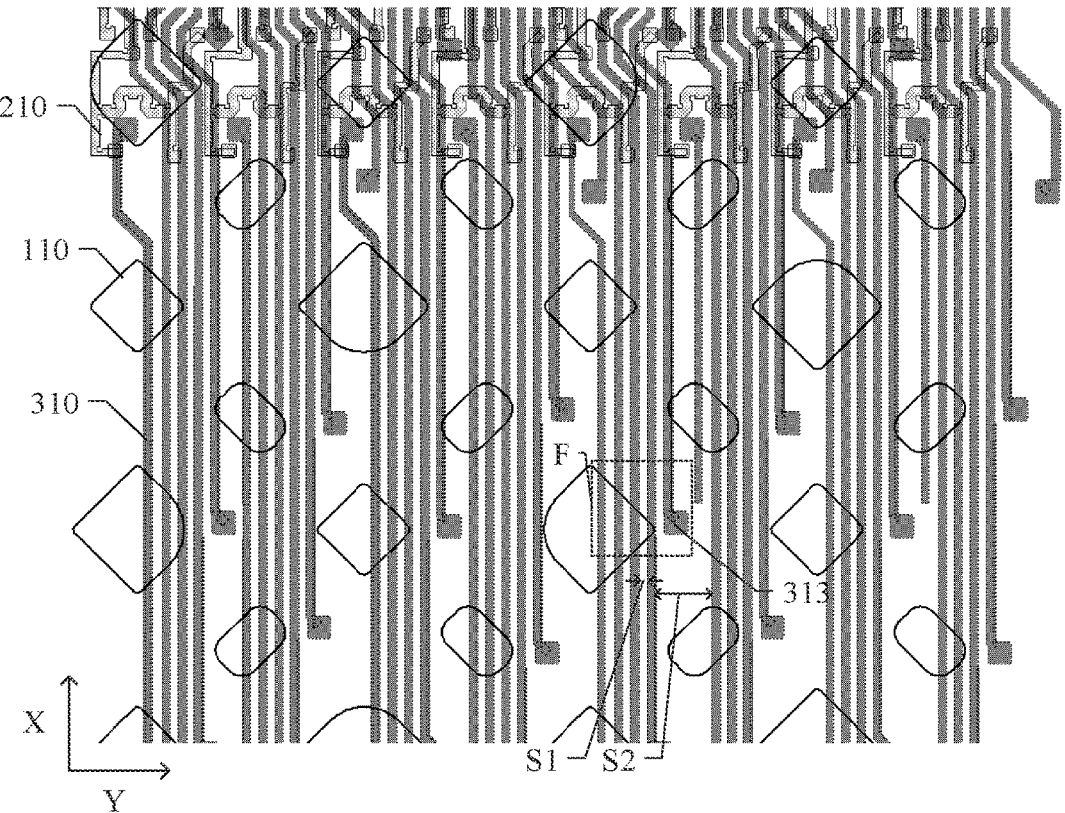
FIG. 13 is an enlarged view of a local region E in the display substrate shown in FIG. 12.
Figure 14:
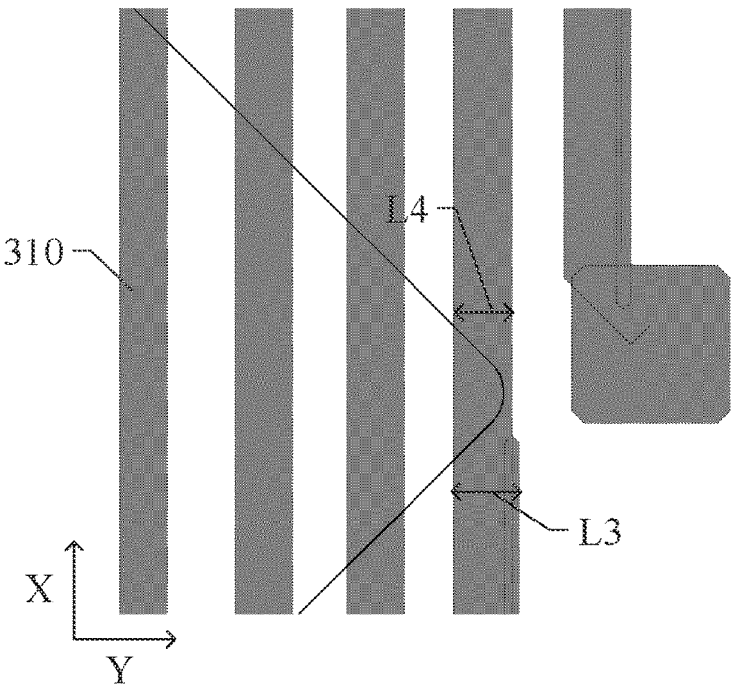
FIG. 14 is an enlarged view of a local region F shown in FIG. 13.

FIG. 13 is an enlarged view of a local region E in the display substrate shown in FIG. 12, and FIG. 14 is an enlarged view of a local region F shown in FIG. 13. For example, as shown in FIGS. 12 to 14, the first display area 10 further includes a third region 13, which is located at the side of the second region 12 away from the first region 11. The dividing line D2 between the first region 11 and the second region 12 shown in FIG. 12 may be the dividing line D2 shown in FIG. 4, and may also be the dividing line D2 shown in FIG. 9, and may also be the dividing line D2 shown in FIG. 10 or the dividing line D2 shown in FIG. 11.

For example, as shown in FIGS. 1 to 14, the line width L3 of at least a portion of at least one first connection trace 310 located in the third region 13 is greater than the line width L2 of at least one first connection trace 310 located in the second region 12.

For example, as shown in FIGS. 12 to 14, the one and same first connection trace 310 located in the third region 13 includes two portions with different line widths; and among the two portions, the line width L4 of the portion close to the first region 11 is smaller than the line width L3 of the portion away from the first region 11. For example, the ratio of the line width L4 of first connection trace 310 at the position where the first connection trace 310 located in the third region 13 has a smaller line width to the line width L2 of first connection trace 310 at the position where the first connection trace 310 located in the second region 12 has a smaller line width may be 0.98 to 1.02. For example, the line width L4 of first connection trace 310 at the position where the first connection trace 310 located in the third region 13 has a smaller line width may be equal to the line width L2 of first connection trace 310 at the position where the first connection trace 310 located in the second region 12 has a smaller line width.

For example, the ratio of the line width L3 of first connection trace 310 at the position where the first connection trace 310 located in the third region 13 has a greater line width to the line width L1 of the first connection trace 310 located in the first region 11 may be 0.98 to 1.02. For example, the line width L3 of first connection trace 310 at the position where the first connection trace 310 located in the third region 13 has a greater line width may be equal to the line width L1 of the first connection trace 310 located in the first region 11.

For example, as shown in FIGS. 12 to 14, along the direction perpendicular to the base substrate, a part of the first light-emitting units 110 in the third region 13 are not overlapped with the first pixel circuits 210; that is, the third region 13 includes first light-emitting units 110 which are shifted with respect to the first pixel circuits 210 as shown in FIG. 7. For example, a part of the first light-emitting units 110 in the third region 13 that are away from the first region 11 are not overlapped with the first pixel circuits 210. For example, along the direction perpendicular to the base substrate, the first light-emitting units 110 electrically connected with at least part of the first pixel circuits 210 are not overlapped with the at least part of the first pixel circuits 210.

For example, the third region 13 is contiguous to the second region 12. The first row of first pixel circuits 210 in the third region 13 may be one row of first pixel circuits 210 electrically connected with the first row of first light-emitting units 110 not overlapped with the first pixel circuits 210, and the last row of first pixel circuits 210 in the second region 12 may be one row of first pixel circuits 210 electrically connected with the last row of first light-emitting units 110 overlapped with the first pixel circuits 210. The dividing line D3 between the third region 13 and the second region 12 may be any dividing line located between the first row of first pixel circuits 210 located in the third region 13 and the last row of first pixel circuits 210 located in the second region 12.

For example, as shown in FIG. 12 to FIG. 14, for at least one first connection trace 310 located in the third region 13, the position where the first connection trace 310 has a greater line width is located at the side of the midpoint of the first connection trace 310 away from the second display area 20.

For example, the first connection traces 310 in the third region 13 that are closer to the second region 12 are distributed more densely, while the first connection traces 310 in the third region 13 that are farther from the second region 12 are distributed more sparsely. The line width L3 at the position where the first connection traces 310 are distributed sparsely is set to be greater than the line width L4 at the position where the first connection traces 310 are distributed densely, which is beneficial to improving the process yield and reducing broken line caused by over-etching of the signal line.

For example, as shown in FIG. 12 to FIG. 14, along the direction perpendicular to the base substrate, at least one first connection trace 310 located in the third region 13 is not overlapped with the first pixel circuit 210 at a position where the first connection trace 310 has a greater line width. For example, in the third region 13, the distribution of the first connection traces 310 is sparse in the region where the first light-emitting unit 110 and the first pixel circuit 210 are not overlapped.

For example, as shown in FIG. 12 to FIG. 14, the at least one first connection trace 310 located in the third region 13 includes a portion with a greater line width, and the portion with a greater line width has different distances from two first connection traces 310 which are adjacent to the at least one first connection trace and located at both sides of the at least one first connection trace. For example, the distance between the portion with a greater line width of the first connection trace 310 and another first connection trace 310 located at one side of the discussed first connection trace 310 is S1, and the distance between the portion with a greater line width of the discussed first connection trace 310 and yet another first connection trace 310 located at the other side of the discussed first connection trace 310 is S2, and S2 is greater than S1.

For example, as shown in FIG. 13, the first connection trace 310 is electrically connected with the corresponding first light-emitting unit 110 through a connection pad 313. For example, the portion with a greater line width of the first connection trace 310 may be set close to the connection pad 313 adjacent to the first connection trace 310.

For example, as shown in FIG. 13, the first connection trace 310 closest to the connection pad 313 located in the third region has a greater line width at a position close to the connection pad 313.

For example, in some examples, the size of the connection pad 313 electrically connected with at least one first connection trace in the third region can be increased in at least one of the first direction or the second direction. For example, the connection pad 313 may be set wider and/or longer.

Figure 15:
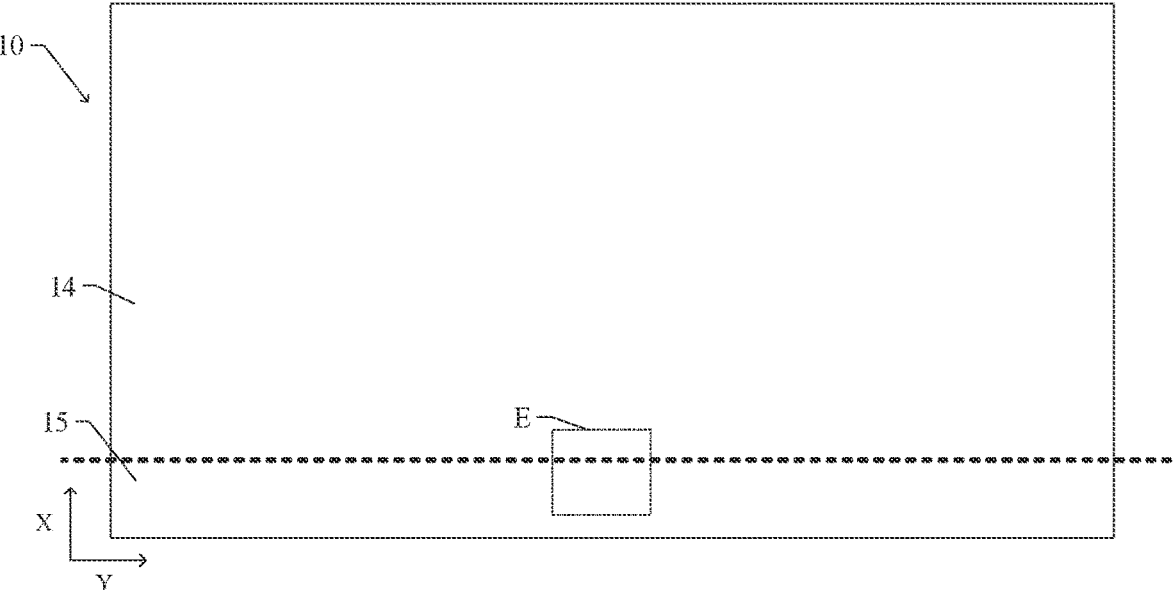
FIG. 15 is a schematic plan view of a first display area in the display substrate shown in FIG. 1.

FIG. 15 is a schematic plan view of a first display area in the display substrate shown in FIG. 1; and FIG. 13 is an enlarged view of a local area E in the display substrate shown in FIG. 15. For example, as shown in FIGS. 2, 7, 13 and 15, the first display area 10 includes a fourth region 14 and a fifth region 15 arranged along the first direction, the fourth region 14 is located between the fifth region 15 and the second display area 20, the plurality of first pixel circuits 210 are all located in the fourth region 14, and the first light-emitting unit 110 located in the fifth region 15 is electrically connected with the first pixel circuit 210 located in the fourth region 14. The fourth region 14 shown in FIG. 15 includes the first region 11, the second region 12 and a part of the third region 13 shown in FIG. 12, while the fifth region 15 includes another part of the third region 13.

Figure 16:
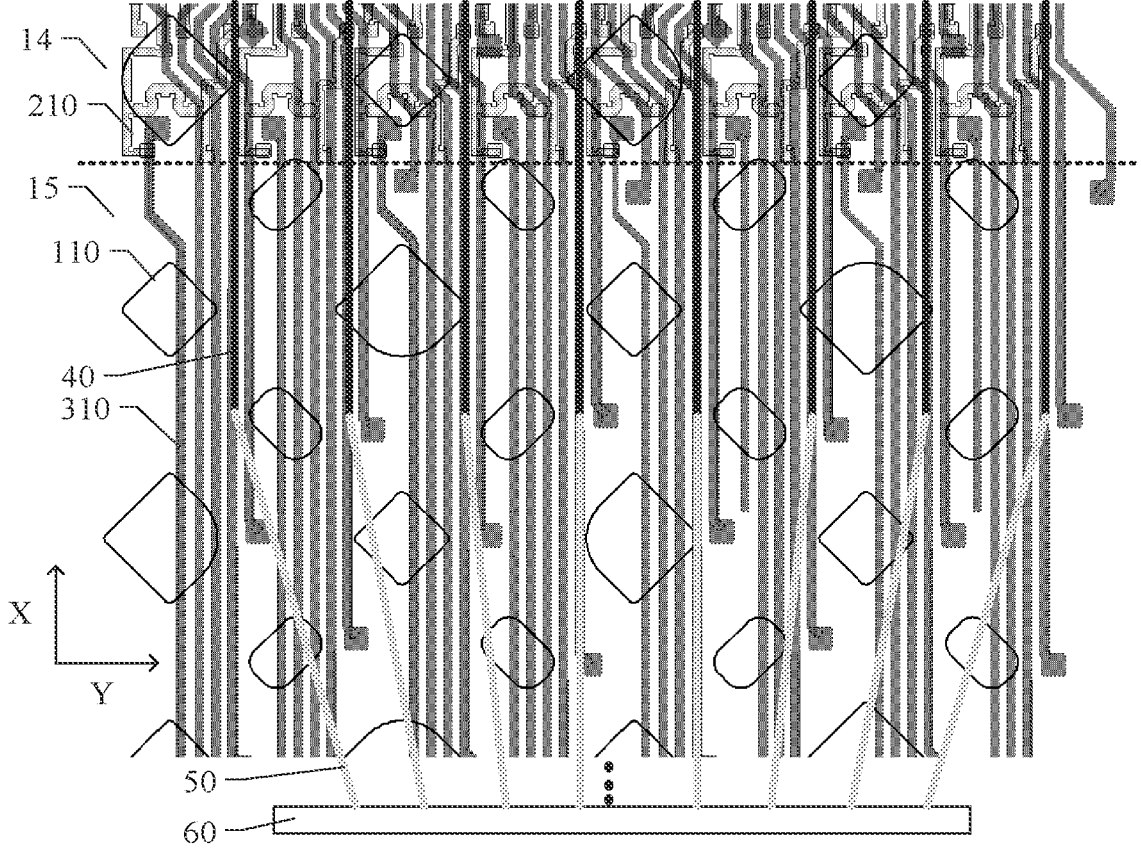
FIG. 16 is a partial structural diagram of the display substrate shown in FIG. 15.

FIG. 16 is a partial structural diagram of the display substrate shown in FIG. 15. For example, as shown in FIGS. 2, 7, 15 and 16, the display substrate further includes a plurality of signal lines 40, a plurality of transmission lines 50 and a driving chip 60. For example, the plurality of signal lines 40 are electrically connected to at least part of the plurality of first pixel circuits 210 and the plurality of second pixel circuits 220. For example, the signal lines 40 may include a data line or a gate line, etc. The signal lines 40 are electrically connected with the first pixel circuit 210 and the second pixel circuit 220, and are configured to transmit signals such as data signals or gate signals to the first pixel circuit 210 and the second pixel circuit 220. For example, the transmission line 50 may be a fanout wiring.

For example, as shown in FIGS. 2, 7, 15 and 16, the driving chip 60 is located at the side of the first display area 10 away from the second display area 20. For example, at least part of the plurality of signal lines 40 is electrically connected to the driving chip 60 through at least part of the plurality of transmission lines 50. For example, the signal provided by the driving chip 60 can be transmitted to the corresponding first pixel circuit 210 and corresponding second pixel circuit 220 through the transmission line 50 and the signal line 40 electrically connected thereto.

For example, as shown in FIGS. 2, 7, 15 and 16, the plurality of signal lines 40 include portions located in the second display area 20 and the fourth region 14. For example, the signal line 40 may further include a portion located in the fifth region 15.

For example, as shown in FIG. 2, FIG. 7, FIG. 15 and FIG. 16, along the direction perpendicular to the base substrate 01, portions of the plurality of transmission lines 50 located in the fifth region 15 are overlapped with the first light-emitting units 110 located in the fifth region 15. According to the embodiment of the present disclosure, the first light-emitting unit not overlapped with the first pixel circuit is arranged to be overlapped with the transmission line, so that the transmission line can be arranged in the first display area, which is beneficial to realizing a narrow bezel.

For example, the first connection trace 310 is located in a film layer between the first pixel circuit 210 and the first light-emitting unit 110. For example, the first connection trace 310 is located between a film layer where the first electrode of the first light-emitting unit 110 is located and a film layer where the second electrode of the first light emission control transistor T6 is located.

For example, the first connection trace 310 may include at least one layer of traces. For example, the first connection trace 310 may include one layer of traces, or two layers of traces, or three layers of traces.

For example, the first connection trace 310 includes a transparent wire.

For example, the first connection trace 310 and the second connection trace 320 may both include a single layer, and both are traces arranged in the same layer.

For example, the first connection trace 310 may include multiple layers of traces while the second connection trace 320 may include a single layer of traces, and the second connection trace 320 may be arranged in the same layer as the single layer of traces of the first connection trace 310.

For example, the second connection trace 320 may be made of the same material as the first connection trace 310.

Another embodiment of the present disclosure provides a display device including any of the above-described display substrates. According to the display device provided by the embodiment of the present disclosure, by adjusting the line width of at least part of the first connection traces in the first display area, it is beneficial to alleviating the display Mura.

For example, the display device provided by the embodiment of the present disclosure may be an organic light-emitting diode display device.

For example, the display device may further include a cover plate located at the display side of the display substrate.

For example, the display device can be any product or component with display function, such as a mobile phone with an under-screen camera, a tablet computer, a notebook computer, a navigator and the like, without limiting the present embodiment thereto.

The Following Statements should be Noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

The invention claimed is:

1. A display substrate, comprising:
a first display area and a second display area, wherein the first display area is on at least one side of the second display area in a first direction,
wherein the first display area comprises a plurality of first light-emitting units and a plurality of first pixel circuits located on a base substrate, and at least one of the plurality of first pixel circuits is electrically connected with at least one of the plurality of first light-emitting units;
the second display area comprises a plurality of second light-emitting units and a plurality of second pixel circuits located on the base substrate, and at least one of the plurality of second pixel circuits is electrically connected with at least one of the plurality of second light-emitting units;
at least part of the plurality of first light-emitting units are electrically connected with corresponding first pixel circuits through first connection traces;
the first display area at least comprises a first region and a second region, wherein the first region is located between the second region and the second display area, and a line width of at least part of at least one first connection trace located in the second region is smaller than a line width of at least one first connection trace located in the first region;
at least part of the second light-emitting units are electrically connected with corresponding second pixel circuits through second connection traces, and a length of at least one first connection trace is greater than a length of at least one second connection trace.

2. The display substrate according to claim 1, wherein the first region is contiguous to the second region, and a maximum distance that a dividing line between the first region and the second region deviates from a straight line passing through a center of the dividing line and extending in a second direction is smaller than a size of one first pixel circuit along the first direction, and the first direction intersects with the second direction.

3. The display substrate according to claim 2, wherein at least one first connection trace passing through the dividing line comprises trace portions located in the first region and the second region respectively, and a line width of the trace portion located in the second region is smaller than a line width of the trace portion located in the first region.

4. The display substrate according to claim 1, wherein the first display area comprises a plurality of first pixel circuit rows arranged in the first direction, and the first pixel circuits in each first pixel circuit row are arranged in a second direction, and the first direction intersects with the second direction,
the first region is contiguous to the second region, and a dividing line between the first region and the second region comprises a dividing line parallel to one first pixel circuit row;
a line width of the first connection trace electrically connected with at least one first pixel circuit located in the second region is smaller than a line width of the first connection trace electrically connected with at least one first pixel circuit located in the first region.

5. The display substrate according to claim 4, wherein the line width of the first connection trace electrically connected with the at least one first pixel circuit located in the second region is set to be uniform, and the line width of the first connection trace electrically connected with the at least one first pixel circuit located in the first region is set to be uniform.

6. The display substrate according to claim 4, wherein the line width of the first connection trace passing through the dividing line is set to be uniform.

7. The display substrate according to claim 1, wherein the first display area further comprises a third region, the third region is located at a side of the second region away from the first region, and a line width of at least a portion of at least one first connection trace located in the third region is greater than a line width of at least one first connection trace located in the second region.

8. The display substrate according to claim 7, wherein, in a direction perpendicular to the base substrate, the at least one first connection trace located in the third region is not overlapped with the first pixel circuit at a position where the at least one first connection trace has a greater line width.

9. The display substrate according to claim 7, wherein a position of the at least one first connection trace located in the third region where the at least one first connection trace has a greater line width is located at a side of a midpoint of the at least one first connection trace located in the third region away from the second display area.

10. The display substrate according to claim 7, wherein a length in the first direction of a portion having a greater line width of the at least one first connection trace located in the third region is greater than a maximum size of a light-emitting region of the first light-emitting unit in the first direction.

11. The display substrate according to claim 7, wherein the at least one first connection trace located in the third region has a portion with a greater line width, and the portion with a greater line width has different distances from two first connection traces which are adjacent to the at least one first connection trace located in the third region with a portion with a greater line width and located at both sides of the at least one first connection trace with a portion with a greater line width.

12. The display substrate according to claim 7, wherein the first display area comprises a fourth region and a fifth region arranged along the first direction; the fourth region is located between the fifth region and the second display area; the fourth region comprises a part of the third region, the first region and the second region, and the fifth region comprises another part of the third region;
the plurality of first pixel circuits are all located in the fourth region, and the first light-emitting unit located in the fifth region is electrically connected with the first pixel circuit located in the fourth region.

13. The display substrate according to claim 12, further comprising:
a plurality of signal lines, electrically connected with at least some of the plurality of first pixel circuits and of the plurality of second pixel circuits;
a plurality of transmission lines; and
a driving chip, located at a side of the first display area away from the second display area;
wherein at least some of the plurality of signal lines are electrically connected with the driving chip through at least some of the plurality of transmission lines, and the plurality of signal lines comprise portions located in the second display area and the fourth region; in a direction perpendicular to the base substrate, portions of the plurality of transmission lines located in the fifth region are overlapped with the first light-emitting units located in the fifth region.

14. The display substrate according to claim 1, wherein the plurality of first light-emitting units comprise a plurality of first color light-emitting units, a plurality of second color light-emitting units, and a plurality of third color light-emitting units, wherein the plurality of first light-emitting units comprise first columns and second columns alternately arranged along a second direction, each first column comprises the first color light-emitting units and the third color light-emitting units alternately arranged along the first direction, and each second column comprises the second color light-emitting units arranged along the first direction; the first direction intersects with the second direction, the first connection trace for connecting at least one first light-emitting unit in the first column comprises a first line width dividing line, and the first connection trace for connecting at least one first light-emitting unit in the second column comprises a second line width dividing line; the first line width dividing line and the second line width dividing line are not in a same straight line.

15. The display substrate according to claim 14, wherein the first line width dividing line is located at a side of the second line width dividing line away from the second display area.

16. The display substrate according to claim 1, wherein the plurality of first light-emitting units are electrically connected with the plurality of first pixel circuits in one-to-one correspondence through a plurality of first connection traces, and at least two first connection traces among the plurality of first connection traces have different lengths; and among the at least two first connection traces, a line width of at least part of positions of the first connection trace with a greatest length is smaller than a line width of the first connection trace with a smallest length.

17. The display substrate according to claim 16, wherein the plurality of first connection traces comprise two groups of first connection traces, a length of the first connection trace with a greatest length in the first group is smaller than a length of the first connection trace with a smallest length in the second group, and a line width of each first connection trace in the first group is set to be uniform and equal and is greater than a line width of at least part of the first connection traces in the second group.

18. The display substrate according to claim 1, wherein, in a direction perpendicular to the base substrate, the first light-emitting units electrically connected with at least some of the first pixel circuits are not overlapped with the at least some of the first pixel circuits.

19. A display device, comprising the display substrate according to claim 1.

20. A display substrate, comprising:

a first display area and a second display area, wherein the first display area is on at least one side of the second display area in a first direction, wherein the first display area comprises a plurality of first light-emitting units and a plurality of first pixel circuits located on a base substrate, and at least one of the plurality of first pixel circuits is electrically connected with at least one of the plurality of first light-emitting units;

the second display area comprises a plurality of second light-emitting units and a plurality of second pixel circuits located on the base substrate, and at least one of the plurality of second pixel circuits is electrically connected with at least one of the plurality of second light-emitting units;

at least part of the plurality of first light-emitting units are electrically connected with corresponding first pixel circuits through first connection traces;

the first display area at least comprises a first region and a second region, wherein the first region is located between the second region and the second display area, and a line width of at least part of at least one first connection trace located in the second region is smaller than a line width of at least one first connection trace located in the first region;

the plurality of first light-emitting units are electrically connected with the plurality of first pixel circuits in one-to-one correspondence through a plurality of first connection traces, and at least two first connection traces among the plurality of first connection traces have different lengths; and among the at least two first connection traces, a line width of at least part of positions of the first connection trace with a greatest length is smaller than a line width of the first connection trace with a smallest length.

* * * * *